(12) United States Patent
Khan et al.

(10) Patent No.: US 12,211,955 B2
(45) Date of Patent: Jan. 28, 2025

(54) METHOD TO CONTROL THE RELAXATION OF THICK FILMS ON LATTICE-MISMATCHED SUBSTRATES

(71) Applicant: The Regents of the University of California, Oakland, CA (US)

(72) Inventors: Kamruzzaman Khan, Ann Arbor, MI (US); Elaheh Ahmadi, Ann Arbor, MI (US); Stacia Keller, Santa Barbara, CA (US); Christian Wurm, Isla Vista, CA (US); Umesh K. Mishra, Montecito, CA (US)

(73) Assignees: THE REGENTS OF THE UNIVERSITY OF CALIFORNIA, Oakland, CA (US); THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 497 days.

(21) Appl. No.: 17/576,716

(22) Filed: Jan. 14, 2022

(65) Prior Publication Data

US 2022/0399475 A1    Dec. 15, 2022

Related U.S. Application Data

(60) Provisional application No. 63/137,502, filed on Jan. 14, 2021.

(51) Int. Cl.
*H01L 33/32* (2010.01)
*H01L 33/00* (2010.01)

(52) U.S. Cl.
CPC .......... *H01L 33/32* (2013.01); *H01L 33/002* (2013.01); *H01L 33/0075* (2013.01)

(58) Field of Classification Search
CPC ... H01L 33/32; H01L 33/002; H01L 33/0075; H01L 21/02507; H01L 21/0242; H01L 21/02458; H01L 21/02505; H01L 21/02513; H01L 21/0254; H01L 21/02631; H01L 21/02658; H01L 33/16
See application file for complete search history.

(56) References Cited

U.S. PATENT DOCUMENTS

| | | | | |
|---|---|---|---|---|
| 2003/0073258 | A1* | 4/2003 | Mukai | B82Y 20/00 257/E29.071 |
| 2011/0012169 | A1* | 1/2011 | Takizawa | H01L 21/02433 257/E33.025 |
| 2012/0091465 | A1* | 4/2012 | Krames | C30B 25/186 257/E33.028 |

(Continued)

*Primary Examiner* — Victor A Mandala
(74) *Attorney, Agent, or Firm* — Gates & Cooper LLP

(57) ABSTRACT

A substrate comprising a III-N base layer comprising a first portion and a second portion, the first portion of the III-N base layer having a first natural lattice constant and a first dislocation density; and a first III-N layer having a second natural lattice constant and a second dislocation density on the III-N base layer, the first III-N layer having a thickness greater than 10 nm. An indium fractional composition of the first III-N layer is greater than 0.1; the second natural lattice constant is at least 1% greater than the first natural lattice constant; a strain-induced lattice constant of the first III-N layer is greater than 1.0055 times the first natural lattice constant; and the second dislocation density is less than 1.5 times the first dislocation density.

18 Claims, 31 Drawing Sheets

(56) References Cited

U.S. PATENT DOCUMENTS

| | | | |
|---|---|---|---|
| 2012/0114002 A1* | 5/2012 | Enya | H01S 5/34333 |
| | | | 438/47 |
| 2012/0223362 A1* | 9/2012 | Belenky | H01L 31/101 |
| | | | 257/190 |
| 2013/0259080 A1* | 10/2013 | Ohta | H01L 21/0242 |
| | | | 372/45.01 |
| 2024/0063340 A1* | 2/2024 | Keller | H01L 21/02664 |

* cited by examiner

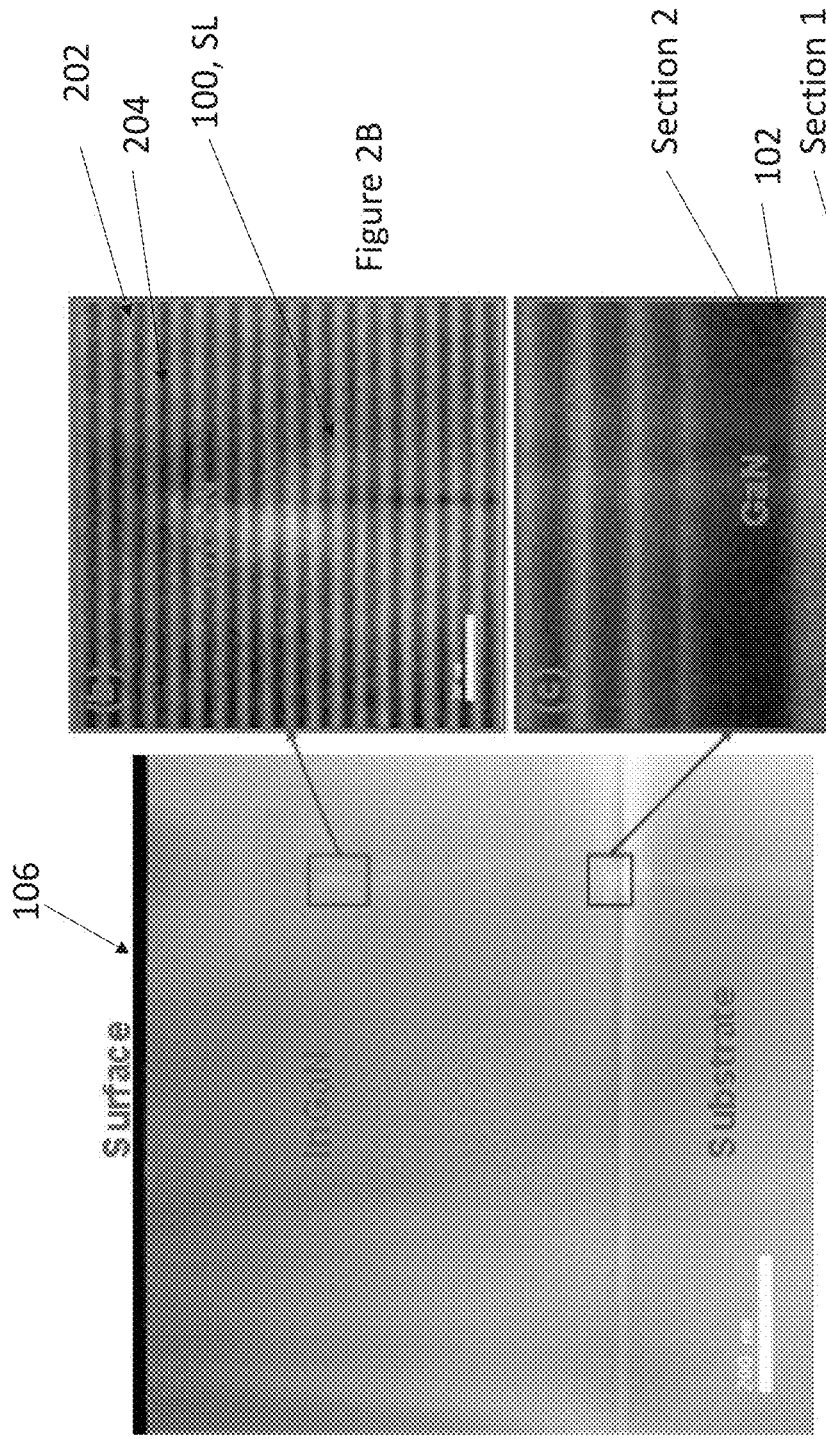

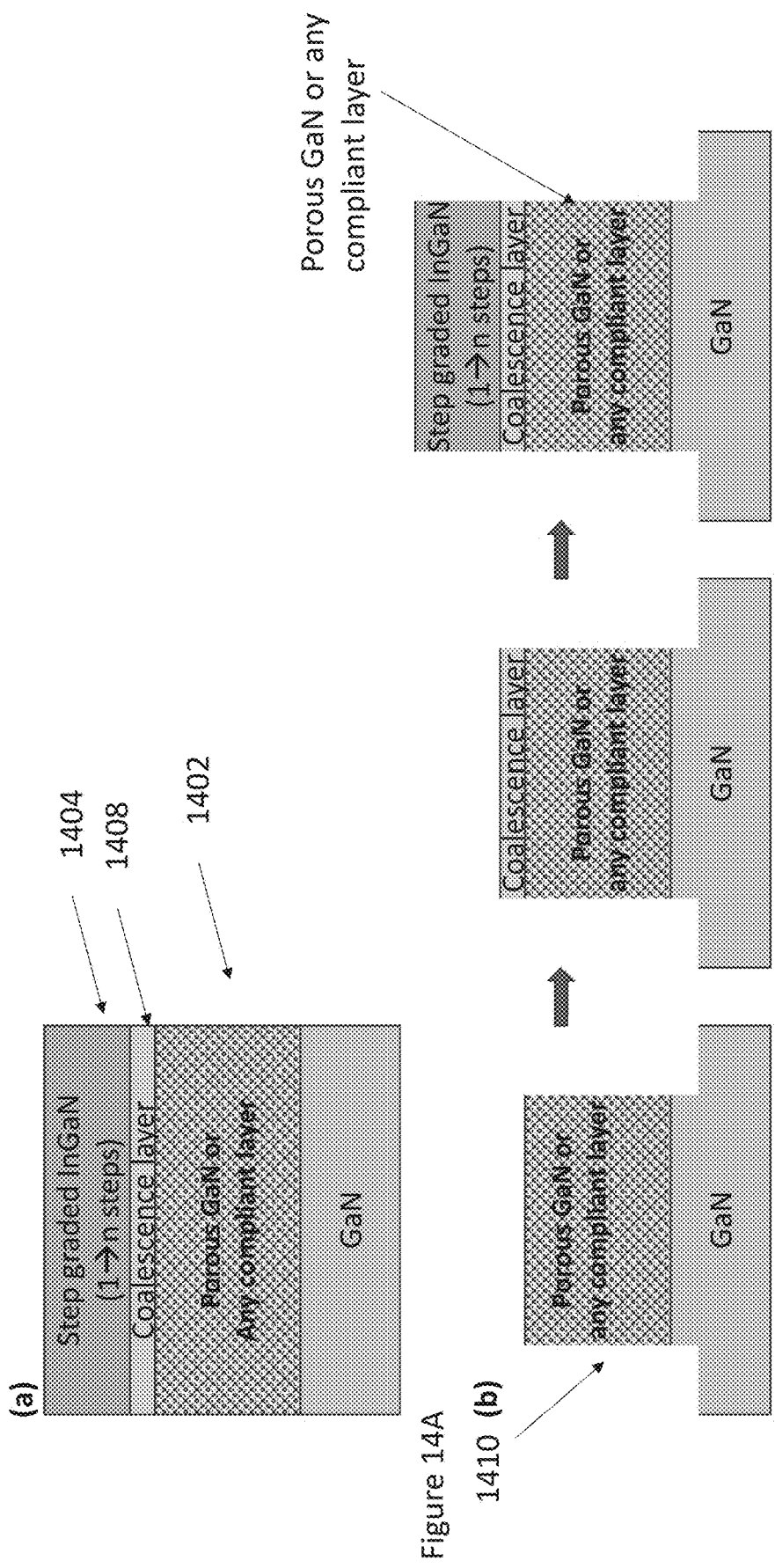

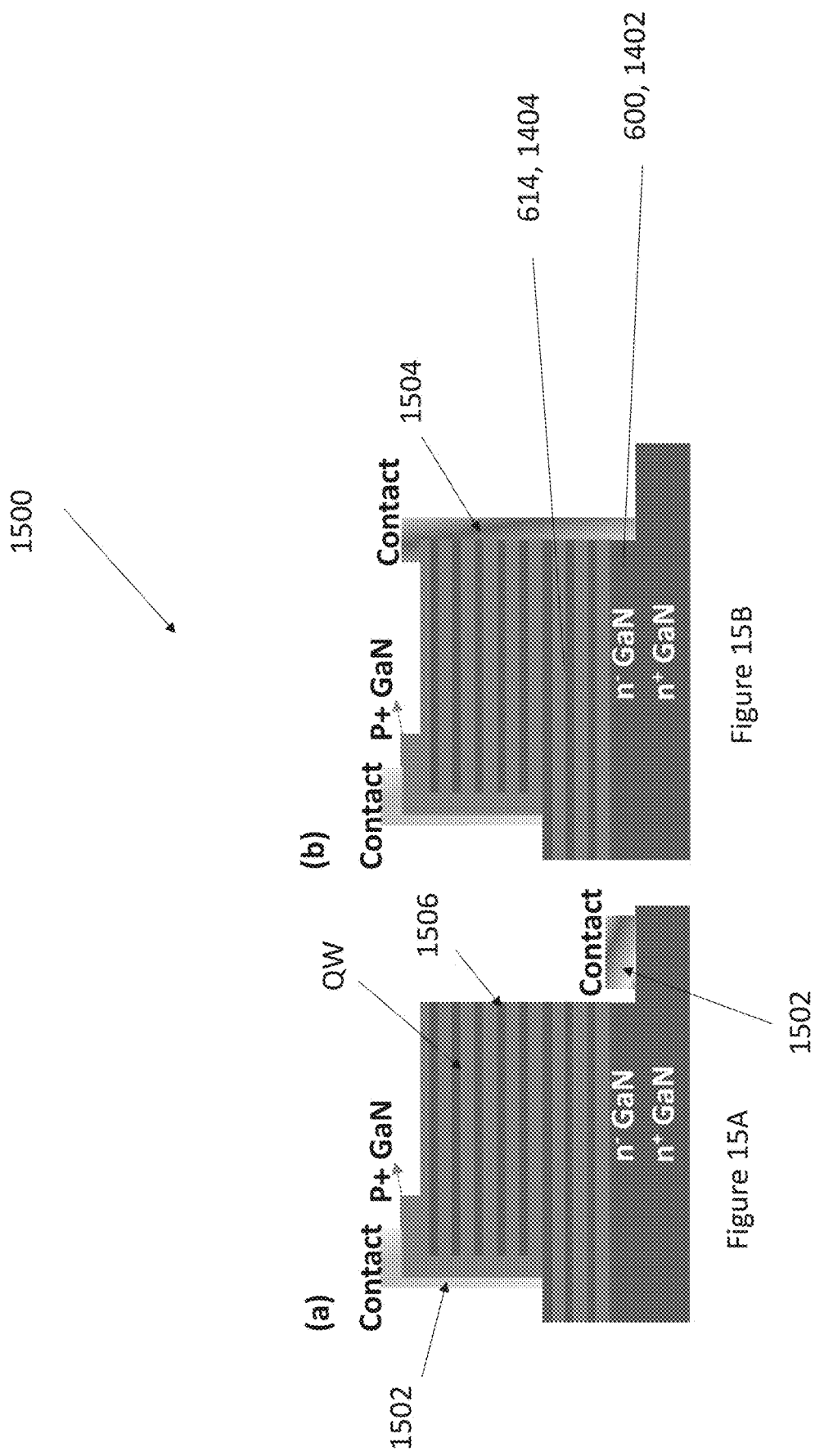

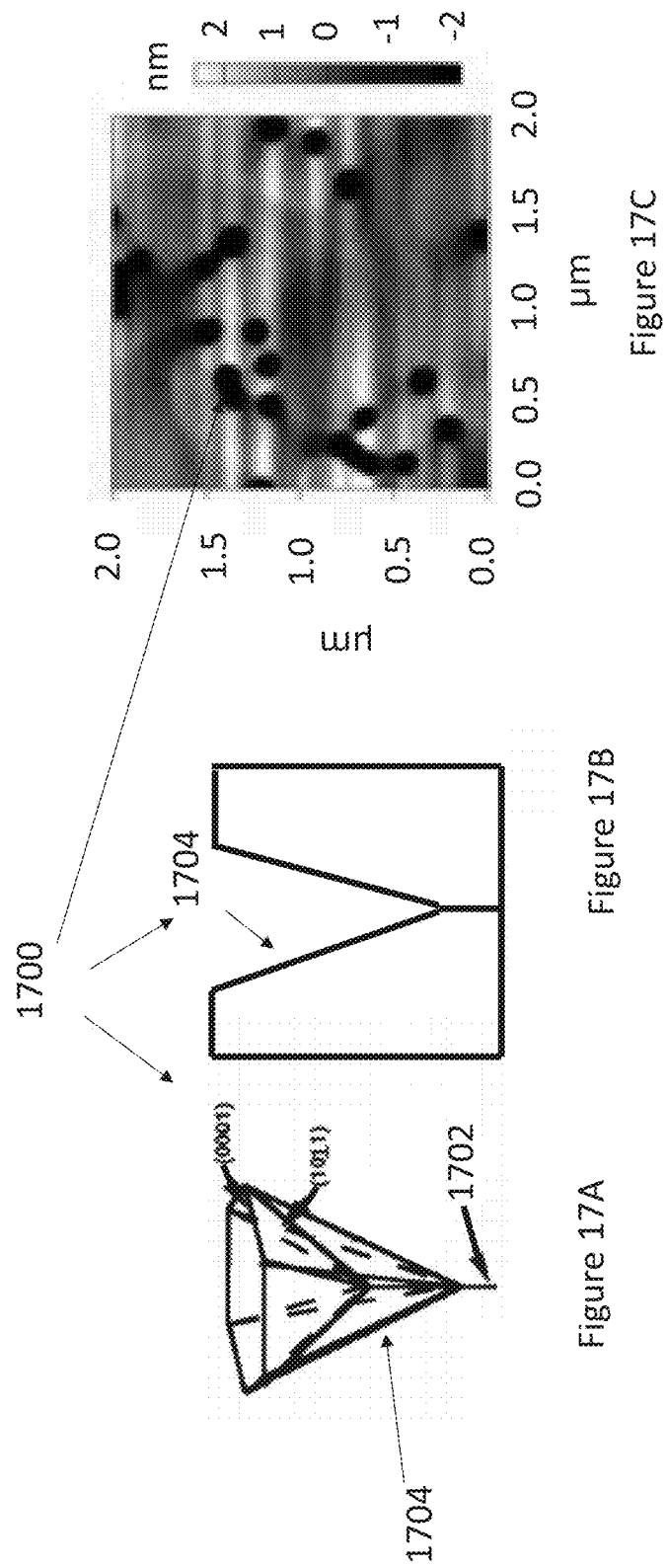

METHOD TO CONTROL THE RELAXATION OF THICK FILMS ON LATTICE-MISMATCHED SUBSTRATES

CROSS REFERENCE TO RELATED APPLICATIONS

This application claims the benefit under 35 U.S.C. Section 119(e) of commonly-assigned U.S. Provisional Patent Application No. 63/137,502, filed Jan. 14, 2021, by Kamruzzaman Khan, Elaheh Ahmadi, Stacia Keller, Christian Wurm, and Umesh Mishra, entitled "METHOD TO CONTROL THE RELAXATION OF THICK FILMS ON LATTICE-MISMATCHED SUBSTRATES,"; which application is incorporated by reference herein.

STATEMENT REGARDING FEDERALLY SPONSORED RESEARCH AND DEVELOPMENT

This invention was made with Government support under Grant numbers N00014-20-1-2138 and N00014-18-1-2703 awarded by the Office of Naval Research (ONR). The Government has certain rights in this invention.

BACKGROUND OF THE INVENTION

1. Field of the Invention

The present disclosure relates to high quality substrates or III-N layers with higher Indium content and methods of making the same.

2. Description of the Related Art

Many active regions for LED III-Nitride devices would benefit from being fabricated with higher indium contents so that they emit green or red light. However, since the semiconductor layers are strained as they are grown on the lattice mismatched base layer (the semiconductor layers are typically formed having a strain-induced lattice constant that is about equal to the natural lattice constant of the base layer), there is a maximum thickness that the semiconductor layers can be grown before they become relaxed. Typically when the layer becomes relaxed, the strain energy in the layer is greater than can be supported, and so the strain is relieved via the generation of threading dislocations or other defects, which allows the (strain-induced) lattice constant of the resulting layer to "relax" to a value that is closer to the natural lattice constant of the layer. However, the generation of threading dislocations and/or other defects typically results in the layer having poor structural, electronic, and/or optical properties. What is needed then, are improved methods for manufacturing device layers with reduced threading dislocation densities. The present disclosure satisfies this need.

SUMMARY OF THE INVENTION

This disclosure enables the fabrication of thick III-N layers such as InGaN (higher than the critical thickness) on lattice mismatched base layers or substrates with varying degrees of relaxation from nearly fully strained to nearly fully relaxed, without the introduction of a large number of additional dislocations and maintaining a smooth surface without V-shaped depressions, enabling high In containing light emitters and novel electronic devices.

The III-N structure, devices, and methods according to the present disclosure can be embodied in many ways including, but not limited to, the following examples.

1. A III-N material structure, comprising:
   a III-N base layer comprising a first portion and a second portion, the first portion of the III-N base layer having a first natural lattice constant and a first dislocation density; and
   a first III-N layer having a second natural lattice constant and a second dislocation density on the III-N base layer, the first III-N layer having a thickness greater than 10 nm; wherein
   an indium fractional composition of the first III-N layer is greater than 0.01;
   the second natural lattice constant is at least 1% greater than the first natural lattice constant;
   a strain-induced lattice constant of the first III-N layer is greater than 1.0055 times the first natural lattice constant; and
   the second dislocation density is less than 1.5 times the first dislocation density.

2. The III-N material structure of example 1, wherein the second portion of the III-N base layer comprises a porous III-N material.

3. The III-N material structure of example 1, wherein the second portion of the III-N base layer comprises porous n-type GaN.

4. The III-N material structure of example 3, wherein at least 33% of a volume of the porous n-type GaN comprises one or more pores.

5. The III-N material structure of example 3, wherein the first III-N layer comprises a material selected from the group consisting of $In_xGa_{1-x}N$ ($0<x\leq1$), $Al_yIn_{1-y}N$ ($0<y<1$), and $Al_wIn_zGa_{1-w-z}N$ ($0<w<1$, $0<z<1$, and $w+z<1$).

6. The III-N material structure of example 1, wherein the first III-N layer is characterized as being substantially free of V-shaped depressions.

7. The III-N material structure of example 1, wherein the first III-N layer is part of a stack comprising a plurality of III-N layers, wherein an indium composition of each III-N layer of the stack increases monotonically in a direction away from the III-N base layer.

8. The III-N material structure of example 1, wherein the material structure comprises a plurality of tiles, each tile comprises the first III-N layer, and the first III-N layer of each tile is separated from the first III-N layer of every other tile by at least 10 nm.

9. A III-N material structure, comprising:
   a porous III-N layer having a first natural lattice constant; and
   a first III-N layer having a second natural lattice constant on the porous III-N layer, the first III-N layer having a thickness greater than 10 nm; wherein
   an indium fractional composition of the first III-N layer is greater than 0.1;
   the second natural lattice constant is at least 1% greater than the first natural lattice constant; and
   a strain-induced lattice constant of the first III-N layer is greater than 1.0055 times the first natural lattice constant.

10. The III-N material structure of example 9, further comprising a substrate selected from the group consisting of silicon, sapphire, gallium nitride, aluminum nitride, and silicon carbide.

11. The III-N material structure of example 9, further comprising a III-N coalescence layer having a third natural lattice constant between the porous III-N layer and the first III-N layer.
12. The III-N material structure of example 11, wherein the third natural lattice constant is different from the second natural lattice constant.
13. A method of forming a III-N material structure, comprising:
   providing a III-N base layer comprising a first portion and a second portion, the first portion of the III-N base layer having a first natural lattice constant and a first dislocation density; and
   epitaxially growing a first III-N layer over the III-N base layer, the first III-N layer having a second natural lattice constant, a second dislocation density, and a thickness greater than 10 nm; wherein
   an indium fractional composition of the first III-N layer is greater than 0.1;
   the second natural lattice constant is at least 1% greater than the first natural lattice constant;
   a strain-induced lattice constant of the first III-N layer is greater than 1.0055 times the first natural lattice constant; and
   the second dislocation density is less than 1.5 times the first dislocation density.
14. The method of example 13, wherein the epitaxially growing of the first III-N layer comprises forming the first III-N layer by molecular beam epitaxy.
15. The method of example 14, wherein the first III-N layer is characterized as being substantially free of V-shaped depressions.
16. The method of example 13, further comprising causing the second portion of the III-N base layer to be porous prior to the epitaxially growing of the first III-N layer.
17. The method of example 13, further comprising epitaxially growing a III-N coalescence layer before the epitaxially growing of the first III-N layer.
18. The method of example 13, wherein the III-N base layer is patterned to form a plurality of tiles prior to the epitaxially growing of the first III-N layer.

BRIEF DESCRIPTION OF THE DRAWINGS

Referring now to the drawings in which like reference numbers represent corresponding parts throughout:

FIG. 1A is recorded using g=01$\bar{1}$0, while FIG. 1B is recorded using g=0002

FIG. 2A. Scanning Transmission Electron Microscope (STEM) image recorded on this sample showing three distinctive sections (i) InGaN film (ii) GaN layer (iii) superlattice structure.

FIG. 2B and FIG. 2C show the superlattice structure in middle of the InGaN layer and the InGaN/GaN interface, respectively.

FIG. 8B: sample with 125 nm InGaN on planar GaN, with 12% In-composition and being 6% relaxed, FIG. 8C: sample with 62 nm InGaN on PS GaN tiles, with 17% In-composition and being 13% relaxed, and FIG. 8D: sample with 125 nm InGaN on PS GaN tiles, with 20% In-composition and being 60% relaxed. The horizontal dashed line running down each scan from the GaN peak shows the strain line while the other dashed line is the fully relaxed line.

FIG. 10C shows that the ~80 nm 550° C. layer 620 on PS (tiled GaN) becomes fully relaxed (i.e., the initial 550° C. layer 620 acts as a compliant layer).

FIGS. 14A-14C: Schematic process flow using planar porous GaN layers as starting structure, wherein FIG. 14A shows coalescing planar porous GaN directly followed by deposition of InGaN layer stack. FIG. 14B shows forming tiles of porous GaN followed by coalescence process and InGaN growth as in FIG. 14A. FIG. 14C shows first forming a coalescence layer followed by tile formation and InGaN deposition.

FIGS. 15A-15B: Schematics of lateral LED structures.

FIG. 17A-17C. Schematic of example V-shaped depressions that are avoided in one or more examples described herein, wherein FIG. 17A is a perspective view, FIG. 17B is a side cross-sectional view, and FIG. 17C is an AFM image top view of an InGaN layer comprising V-defects.

DETAILED DESCRIPTION OF THE INVENTION

Figures 1A, 1B:
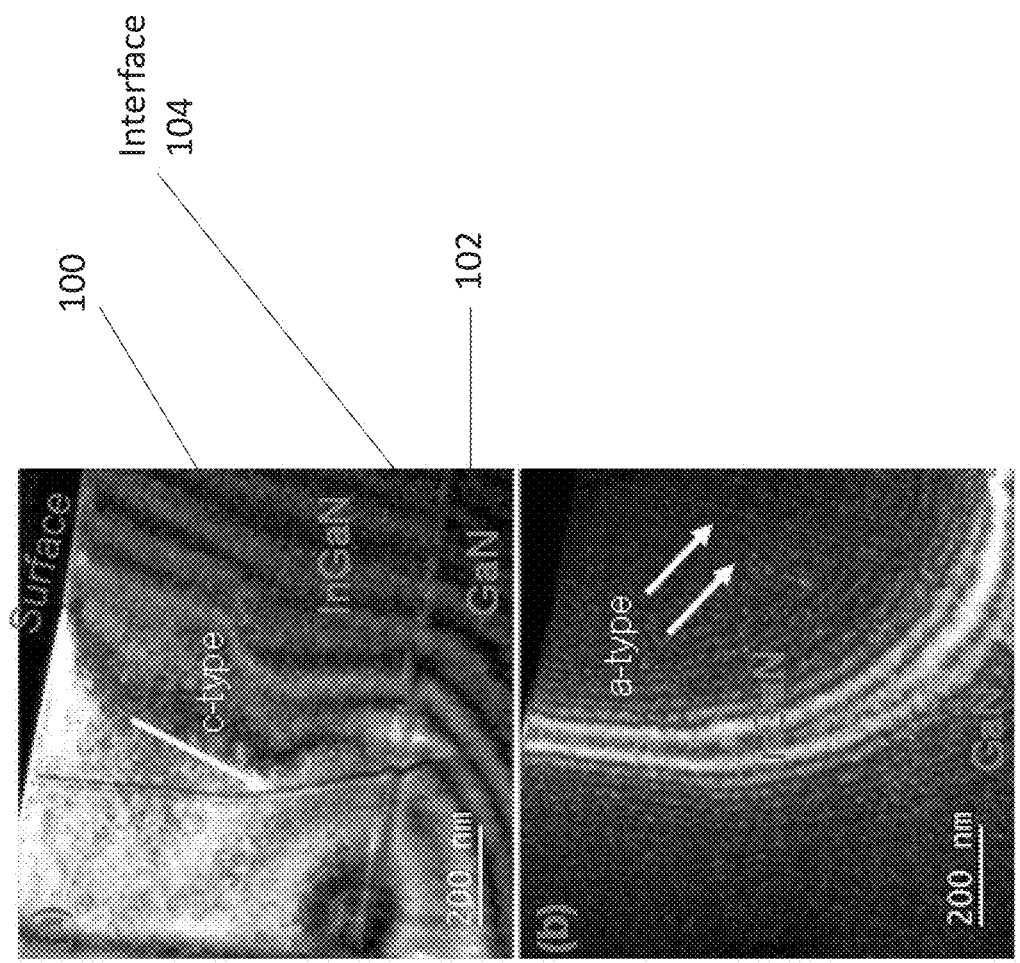
FIGS. 1A-1B: weak beam dark field (WBDF) TEM images near <2110> zone axis under two-beam condition.
Figure 3B:
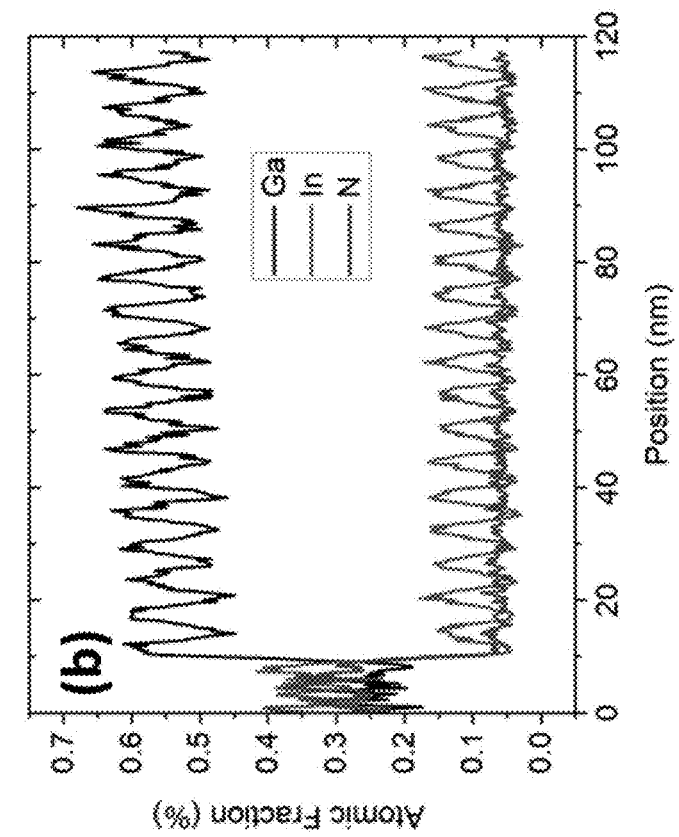
FIGS. 3A-3B: Energy Dispersive X-ray Spectroscopy (EDS) of a region adjacent to the GaN interface (FIG. 3A), and a region adjacent to the InGaN surface (FIG. 3B).
Figure 3A:
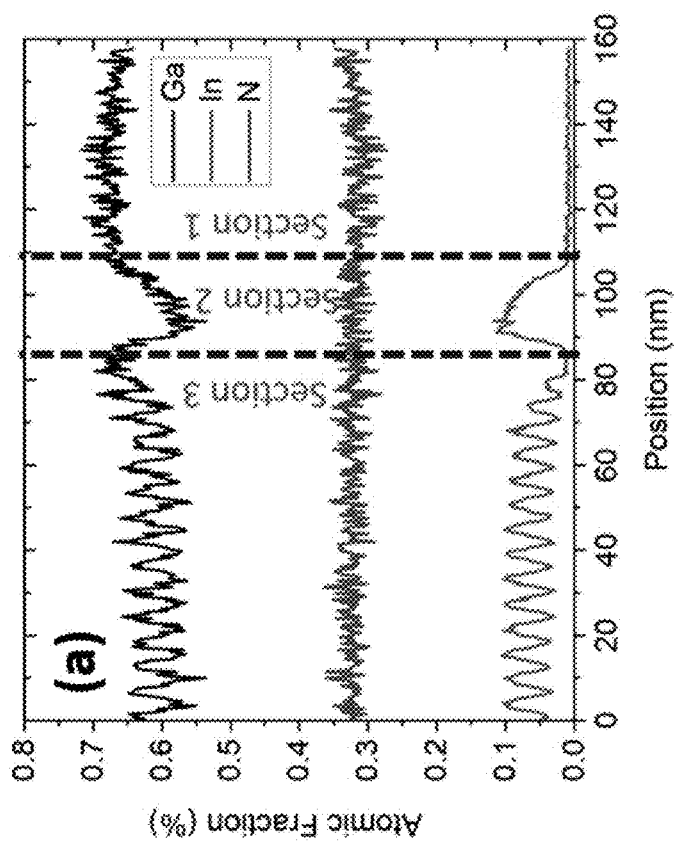
Figure 4:
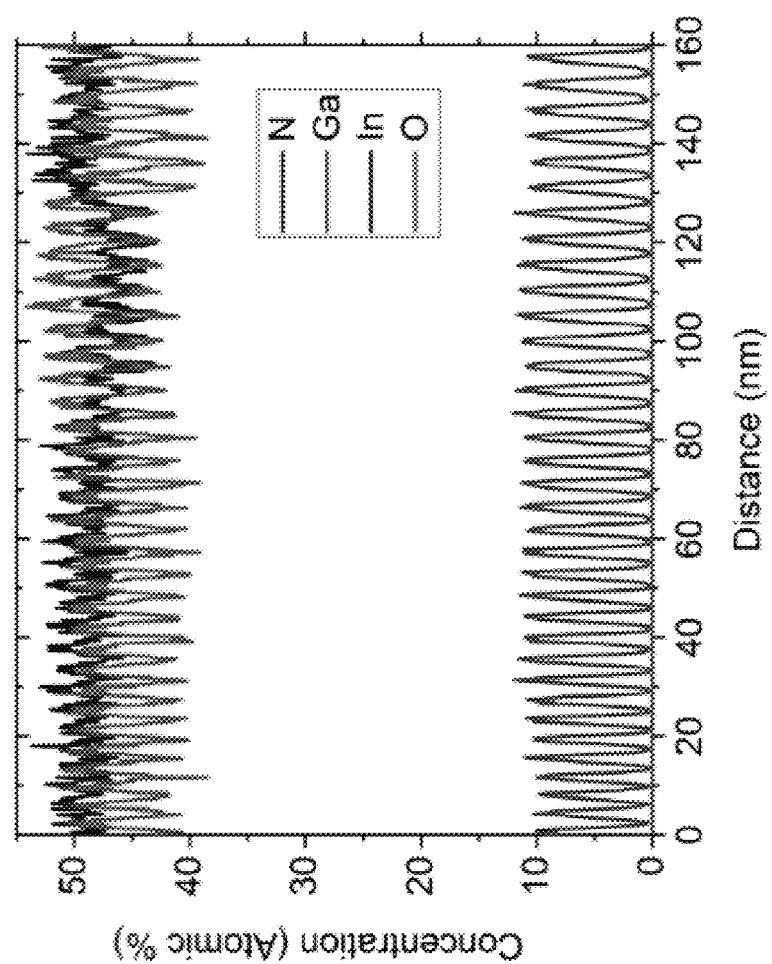
FIG. 4: Atom Probe Tomography (APT) analysis of InGaN with In, Ga, N concentrations.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

In many semiconductor device applications, it is desirable or necessary to form semiconductor material layers of high structural quality on a substrate or a buffer layer (e.g., a base layer) having a different natural lattice constant from that of the substrate or base layer, where the "natural lattice constant" of a material refers to the lattice constant when the material is not strained (e.g., zero strain as assessed by X-ray diffraction (XRD) reciprocal space maps). Forming these semiconductor layers by metalorganic chemical vapor deposition (MOCVD) is often the preferred method due to low cost, simplicity, and the resulting high quality interfaces. However, since the semiconductor layers are strained as they are grown on the lattice mismatched base layer (the semiconductor layers are typically formed having a strain-induced lattice constant that is about equal to the natural lattice constant of the base layer), there is a maximum thickness that the semiconductor layers can be grown before they become relaxed. Typically when the layer becomes relaxed, the strain energy in the layer is greater than can be supported, and so the strain is relieved via the generation of threading dislocations or other defects, which allows the (strain-induced) lattice constant of the resulting layer to "relax" to a value that is closer to the natural lattice constant of the layer. However, the generation of threading dislocations and/or other defects typically results in the layer having poor structural, electronic, and/or optical properties.

Described herein are methods of epitaxially growing thick layers of III-N semiconductor materials of controlled degree of relaxation on lattice mismatched substrates or buffer layers (e.g., III-N base layers) without generating a substantial number of new defects (e.g., new threading dislocations). Also described are the material structures that result from these methods. The III-N semiconductor material may include or be formed of an indium-containing compound, for example $In_xGa_{1-x}N$ (0<x≤1), $Al_yIn_{1-y}N$ (0<y<1), or $Al_wIn_zGa_{1-w-z}N$ (0<w<1, 0<z<1, and w+z<1). In some cases, the natural lattice constant of the III-N semiconductor material may be at least 0.8% (e.g., at least 0.9%, at least 1%, at least 1.1%, at least 1.2%, at least 1.3%, at least 1.4%, at least 1.5%, at least 1.6%, at least 1.7%, at least 1.8%, at least 1.9%, or at least 2%) greater than the natural lattice constant of the III-N base layer over which it is grown. The methods and structures described herein may allow for epitaxial growth of $In_xGa_{1-x}N$ layers (0<x≤1) on a III-N base layer (e.g., a III-N substrate or a III-N buffer layer), where the III-N base layer may be formed of GaN, the indium fractional composition x of the $In_xGa_{1-x}N$ layer is relatively large (e.g., x is greater than 0.08, greater than 0.09, greater than 0.1, greater than 0.11, greater than 0.12, greater than 0.13, greater than 0.14, greater than 0.15, greater than 0.16, greater than 0.17, greater than 0.18, greater than 0.19, or greater than 0.2) and the $In_xGa_{1-x}N$ layer is thick (e.g., having a thickness of at least 10 nm, at least 20 nm, at least 30 nm, at least 40 nm, at least 50 nm, at least 60 nm, at least 70 nm, at least 80 nm, at least 90 nm, or at least 100 nm) and relaxed (or at least partially relaxed). The $In_xGa_{1-x}N$ layer can be grown either as a single layer over an entire semiconductor wafer, or on multiple smaller tiles that are formed on the wafer.

In any of the structures described herein, at least a portion of the III-N base layer can be porosified, thereby causing the porosified portion of the III-N base layer to be porous. For example, the III-N base layer can be entirely porous, or can include a first portion that is non-porous and a second portion that is porous. Porous III-N materials such as porous GaN can be formed by electrochemical etching of n-type material (e.g., n-type GaN). The typical n-type dopant for GaN is silicon. Thereby the porosification can be achieved by etching of a planar GaN:Si top layer on a substrate from the surface, or by lateral porosification of embedded GaN:Si layers from the side of etched tiles, mesas, or fins, both of which are described in the examples below. Accordingly, the III-N base layer can include a second portion that is doped n-type and is porosified and a first portion that is undoped, unintentionally doped, p-doped, or is otherwise not doped n-type and is non-porous. In the porosification process, at least 25% of the original GaN material may be removed under formation of the pores, such that at least 33% of the volume of the remaining layer comprises one or more pores.

The porous material may allow for the relaxation (or at least partial relaxation) of the layers grown thereover without causing substantial formation of additional defects (e.g., threading dislocations). For example, the dislocation density of the relaxed (or partially relaxed) layer(s) grown over the III-N base layer may be less than 1.5 times the dislocation density of the non-porous portion of the III-N base layer. Furthermore, when the III-N layer(s) grown over the III-N base layer are relaxed (or partially relaxed), the strain-induced lattice constant of the overlying III-N layer(s) can be greater than the natural lattice constant of the III-N base layer. For example, the strain-induced lattice constant of the overlying III-N layer can be greater than 1.0055 times the natural lattice constant of the III-N base layer. If no additional III-N layers are grown above the overlying III-N layer or between the III-N base layer and the overlying III-N layer, the strain-induced lattice constant of the overlying III-N layer will be less than or equal to the natural lattice constant of the overlying III-N layer. As an example, when the III-N base layer is porous GaN and the overlying III-N layer is $In_{0.1}Ga_{0.9}N$, the natural lattice constant of the III-N base layer is 0.31893 nm, the natural lattice constant of the overlying III-N layer is 0.322417 nm, and the strain-induced lattice constant of the overlying III-N layer can be greater than 0.3207 nm. If further InGaN layers with an In composition higher than the $In_{0.1}Ga_{0.9}N$ are deposited on top of the $In_{0.1}Ga_{0.9}N$ layer, the strain-induced lattice constant of the $In_{0.1}Ga_{0.9}N$ can also be larger than its natural lattice constant (0.322417 nm).

The III-N (e.g., GaN) unintentionally doped (UID) layers and the n-type layers for future porosification (collectively the III-N base layer) can be deposited on foreign substrates such as Sapphire or Silicon Carbide with a threading dislocation density (in the non-porous portion of the III-N base layer) of less than $8 \times 10^8$ cm$^{-2}$, or Silicon with a threading dislocation density (in the non-porous portion of the III-N base layer) of less than $2 \times 10^9$ cm$^{-2}$, or on bulk GaN, for example. The III-N material described herein may be epitaxially grown by any suitable method, for example metalorganic chemical vapor deposition (MOCVD), molecular beam epitaxy (MBE), or halide vapor phase epitaxy (HYPE). However, in some cases it has been found that III-N layers grown over porous III-N material exhibit V-shaped depressions when grown by MOCVD, but are substantially free of these V-shaped depressions when formed by MBE. The V-shaped depressions are undesirable in that they may degrade the performance of devices formed from the III-N material structures. The following examples illustrate various example structures and methods in which thick InGaN layers are grown on porous GaN. In each example, the InGaN layers are at least partially relaxed without a substantial increase in threading dislocation density (as compared to the threading dislocation density of the underlying porous GaN).

Figure 6:
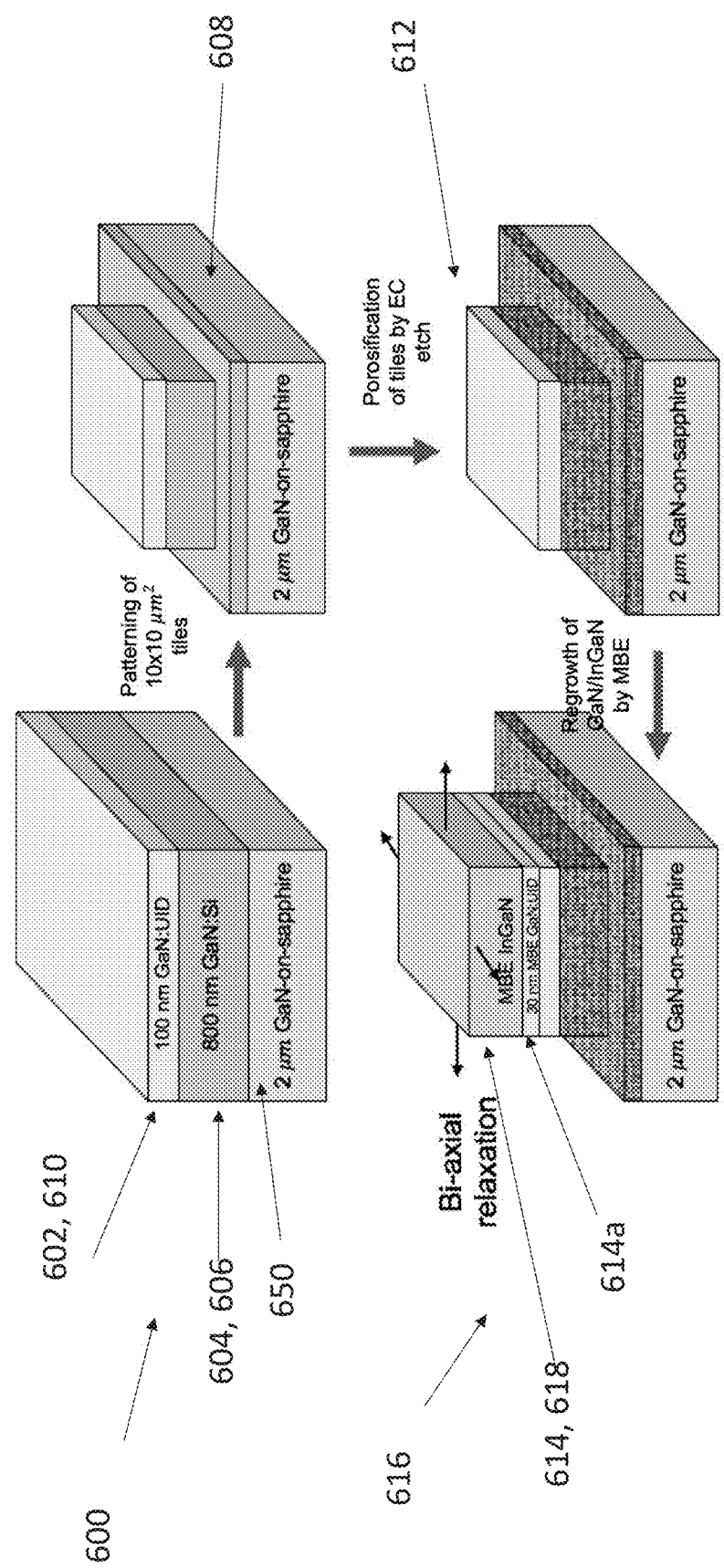
FIG. 6: Process flow for obtaining high-quality relaxed InGaN on porous GaN PS. Starting from top left, MOCVD growth of 800 nm GaN:Si/100 nm GaN:UID; top right, patterning and etching of 10×10 μm$^2$ tiles; bottom right, porosification of tiles by electro-chemical (EC) etch; and bottom left, MBE regrowth on UID GaN and InGaN resulting in bi-axial relaxation.
Figure 7A:
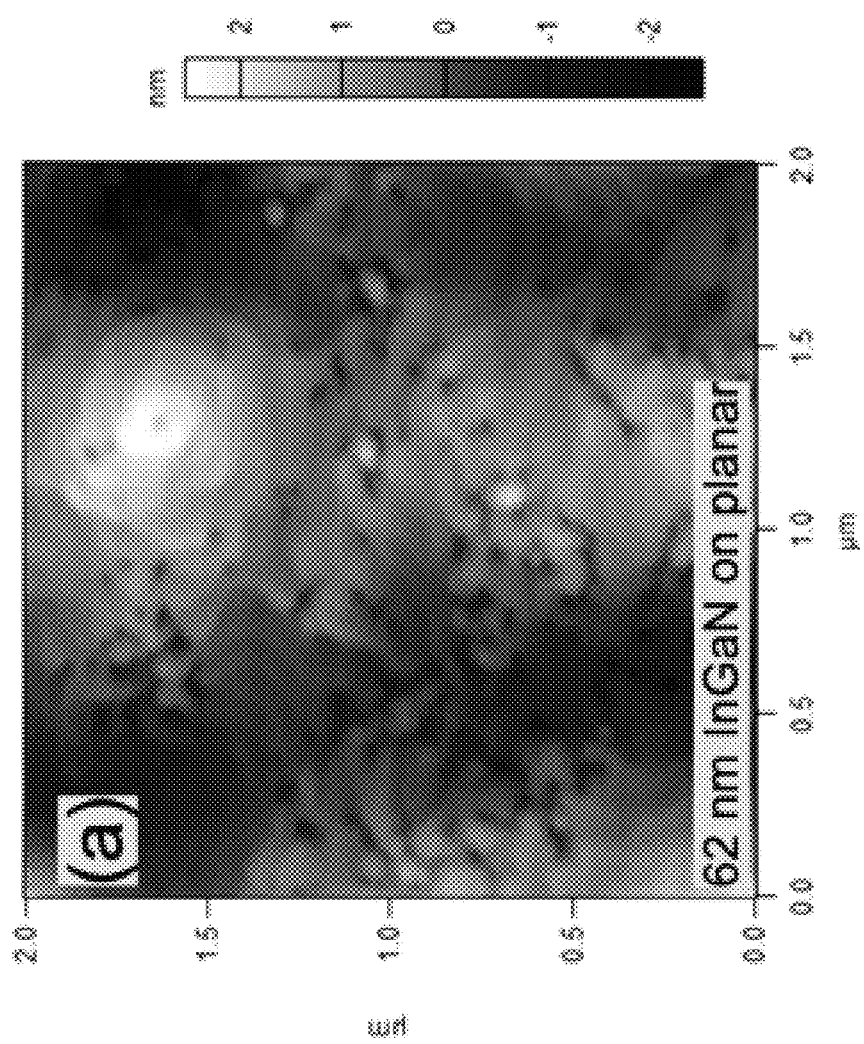
FIGS. 7A-7D: 2×2 μm$^2$ Atomic Force Microscope (AFM) micrographs for 62 nm thick InGaN deposited on planar GaN (FIG. 7A) and GaN tiles (FIG. 7B), and 125 nm thick InGaN deposited on planar GaN (FIG. 7C) and GaN tiles (FIG. 7D). Surface RMS values extracted from (a) to (d) were 0.8 nm, 1 nm, 1.11 nm and 2.04 nm respectively. Z-range for all four micrographs is 5 nm.
Figure 7B:
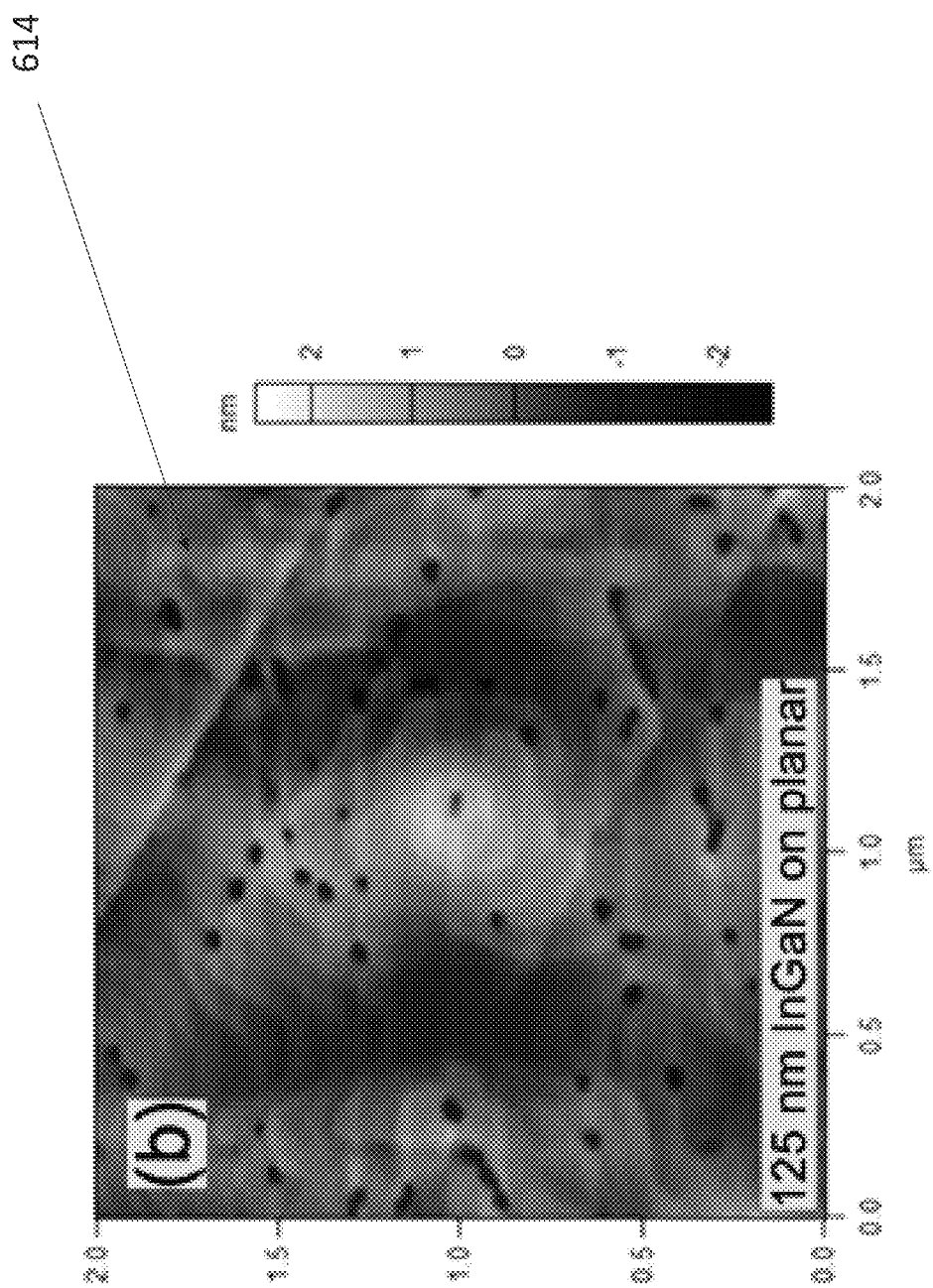
Figure 7C:
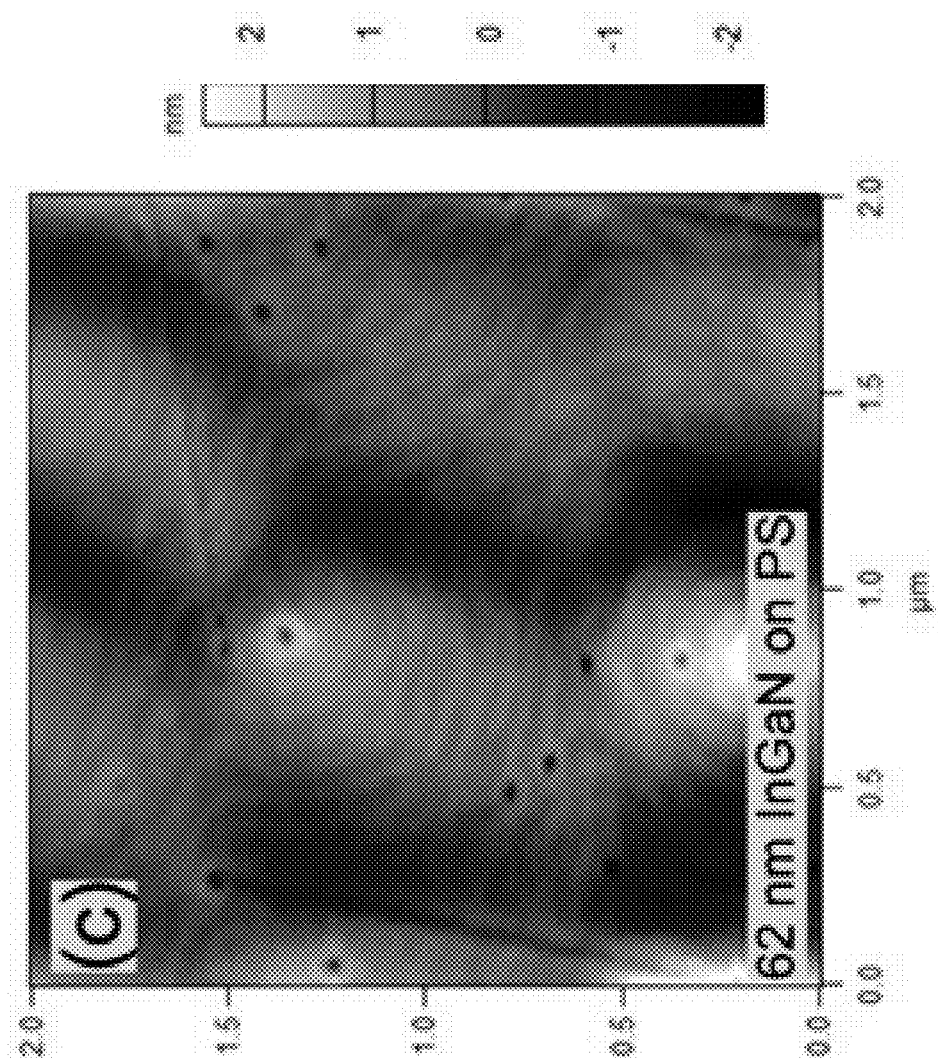
Figure 7D:
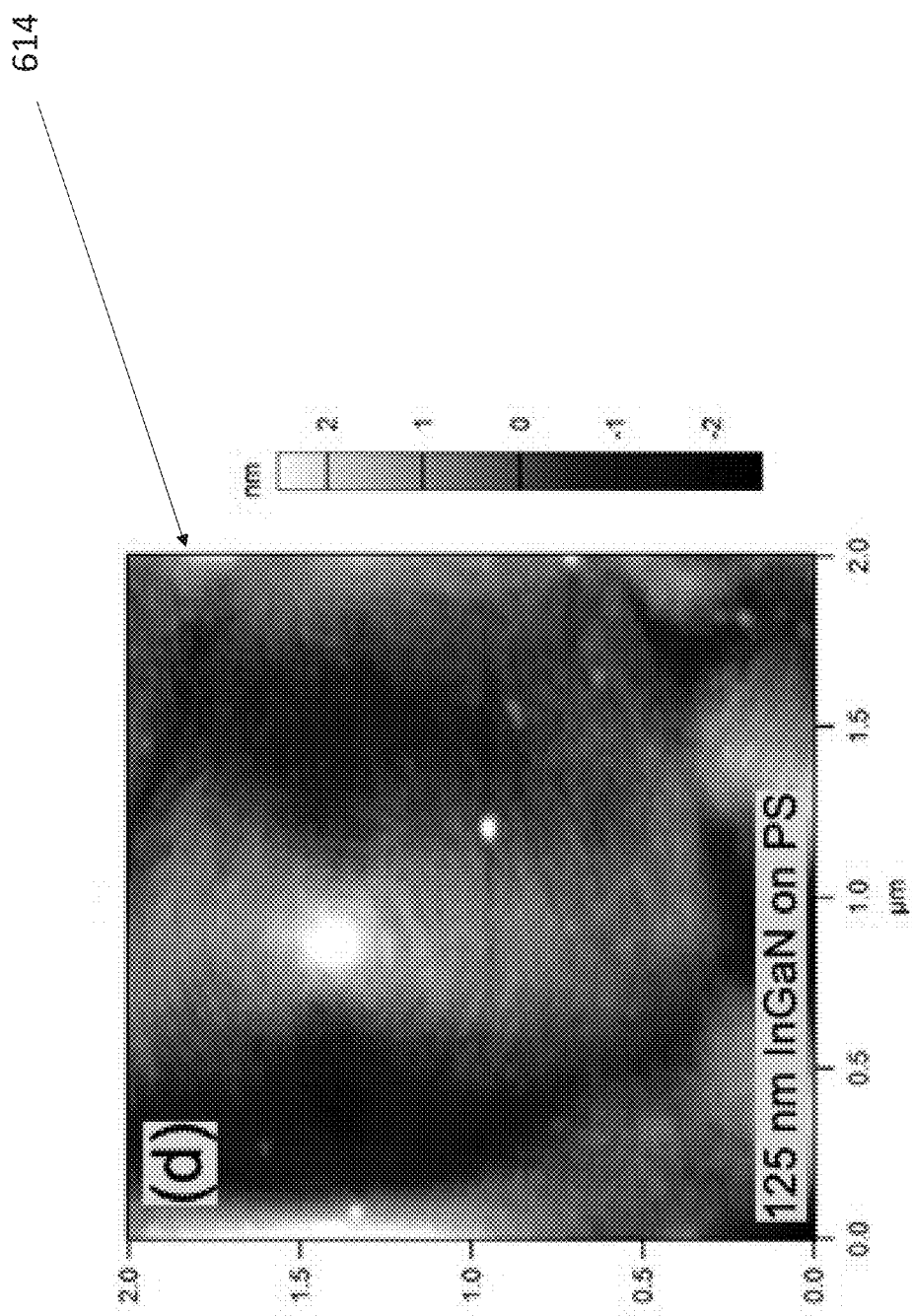
Figure 8A:
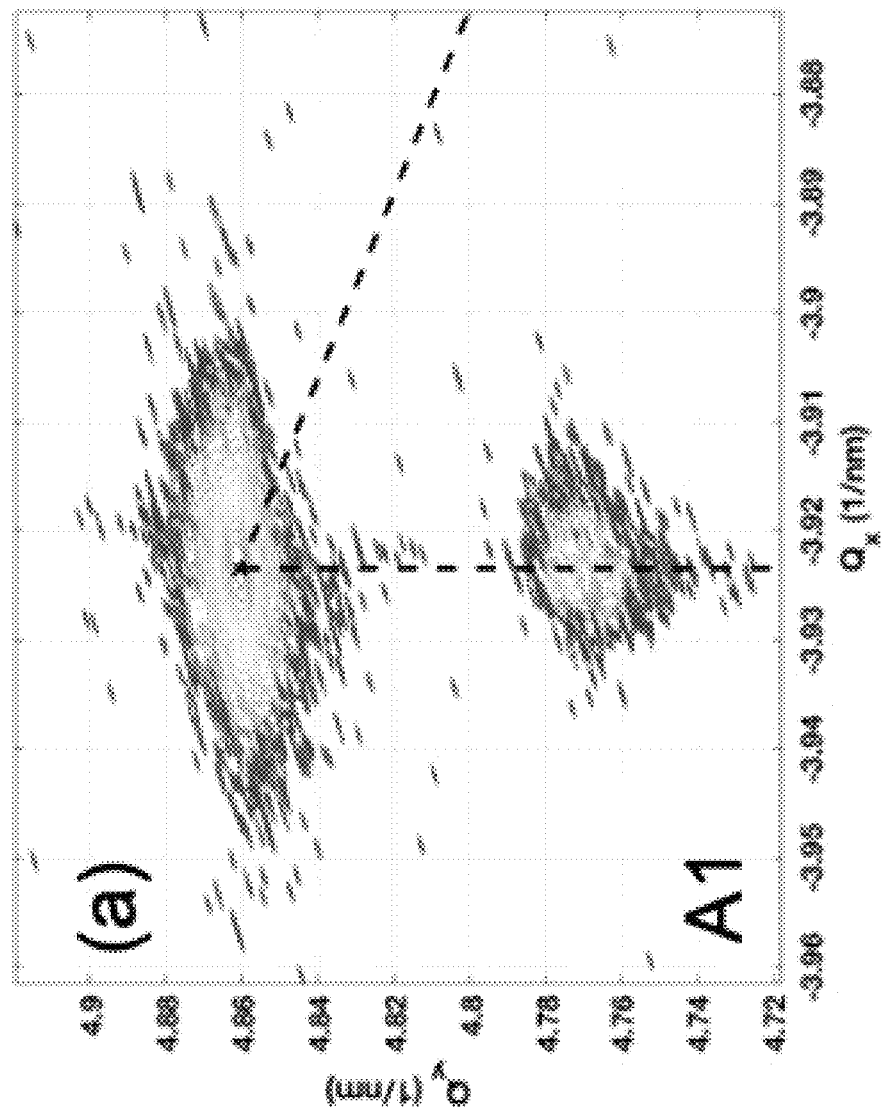
FIGS. 8A-8D: {$\bar{1}\bar{1}24$} X-ray Diffraction-Reciprocal Space Maps (XRD RSM) scans for FIG. 8A: sample with 62 nm InGaN on planar GaN (FIG. 8A), with 12% In-composition and being coherently strained to GaN.
Figure 8B:
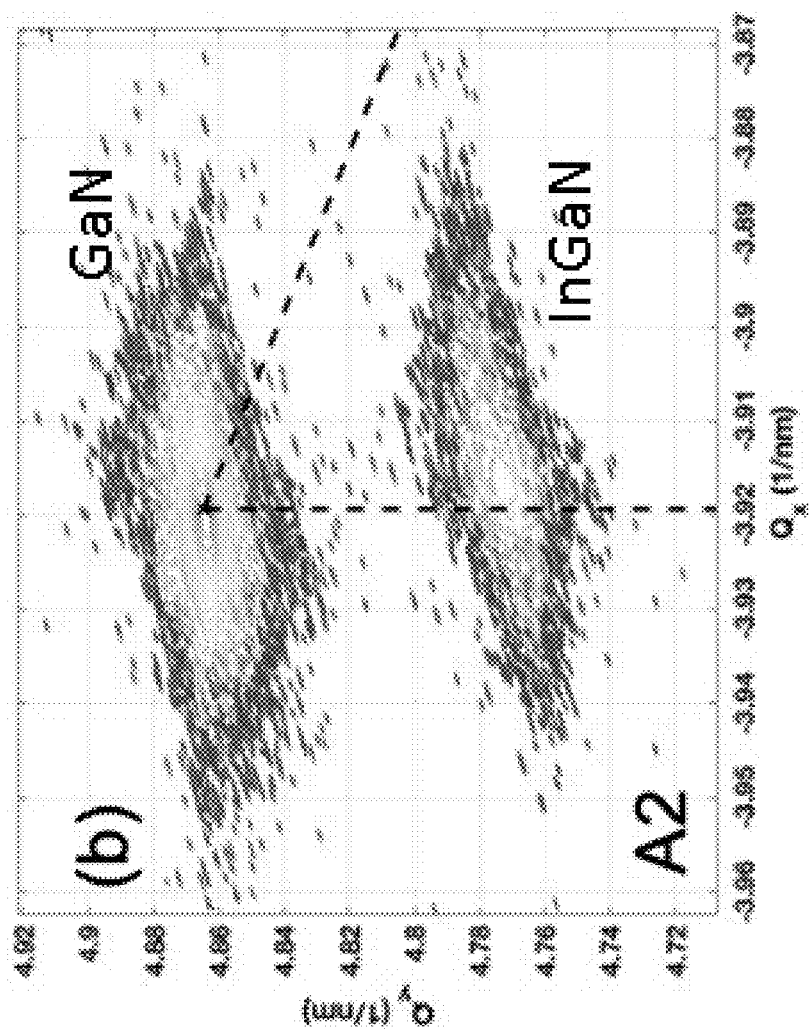
Figure 8C:
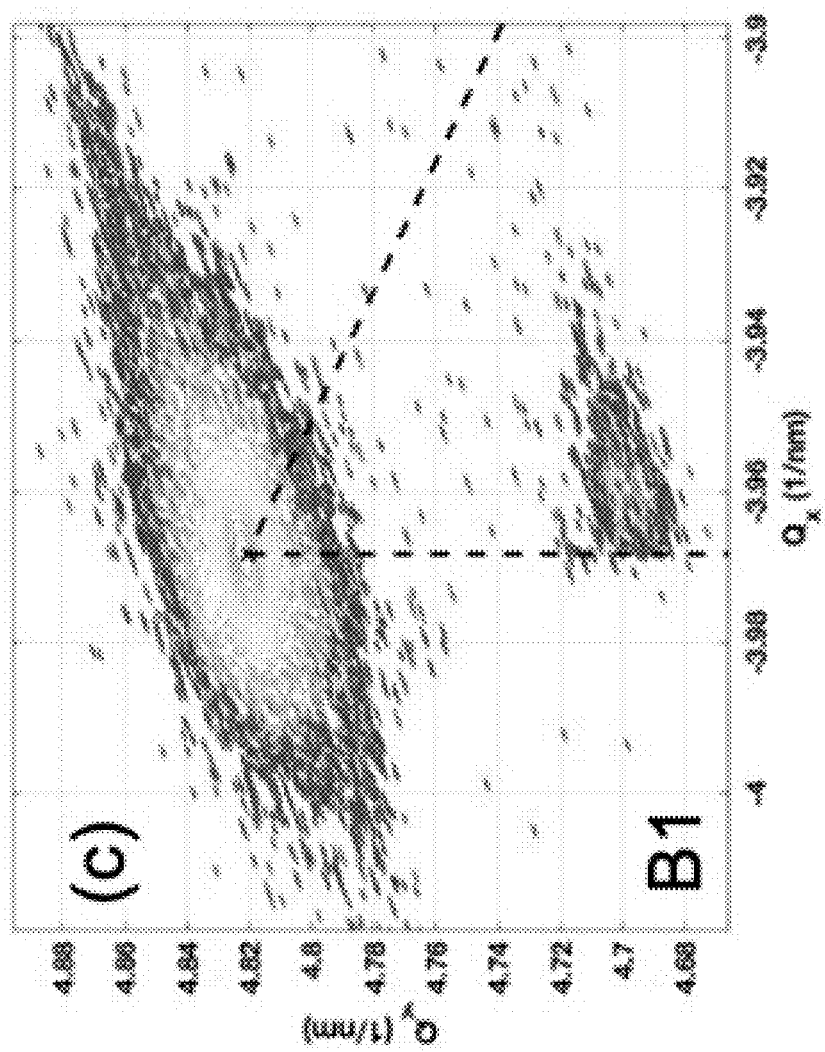
Figure 8D:
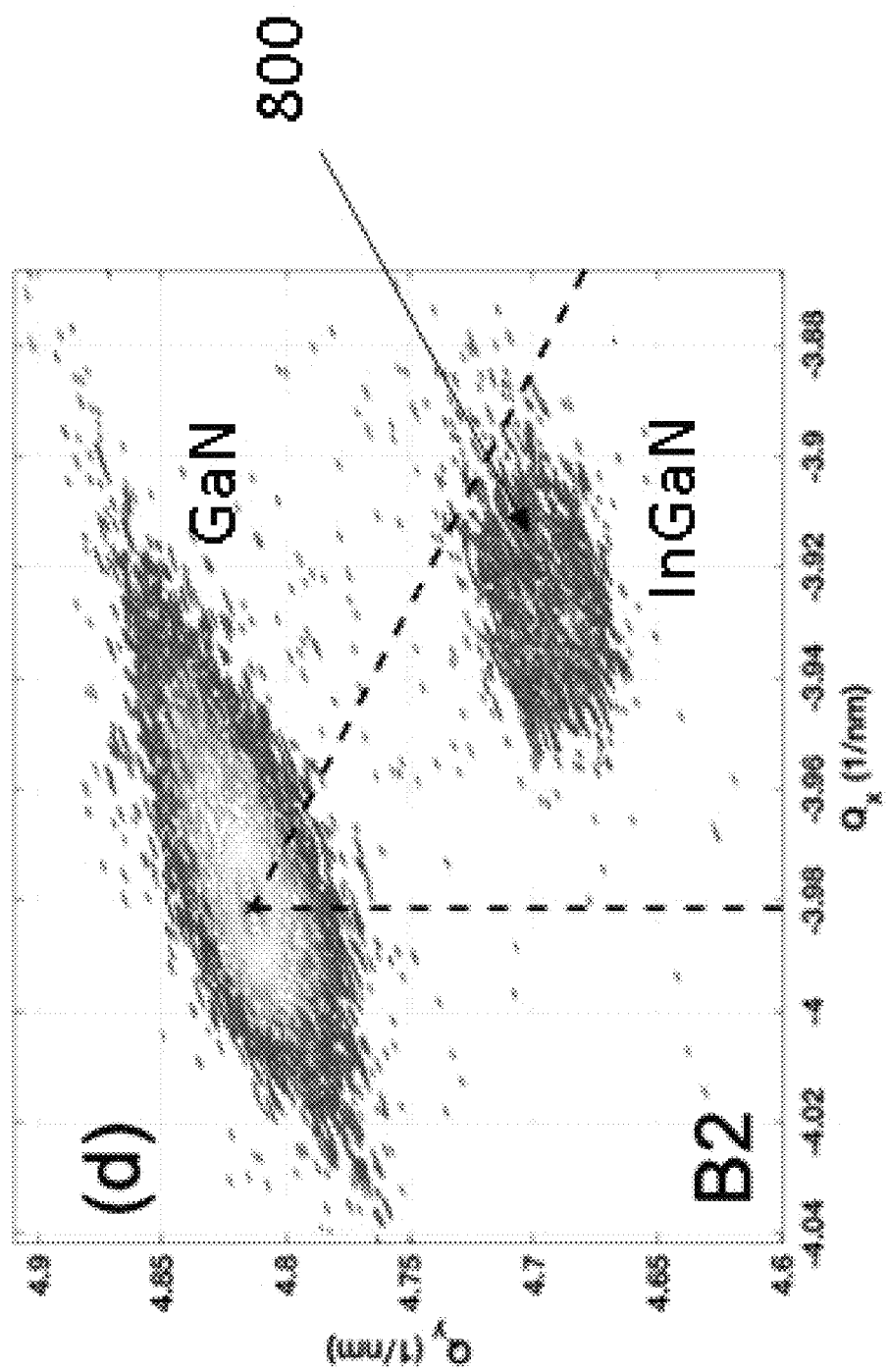

Example 1: Relaxation of InGaN Grown on GaN Tiles with Embedded Porous GaN Layer Two wafers were formed with InGaN grown on GaN tiles that each had an embedded porous GaN layer. For each wafer, a plurality of 10 micron by 10 micron square GaN tiles were formed on a sapphire substrate, after which a portion of the GaN was porosified and a relaxed InGaN layer was grown over the porous GaN on each of the tiles. The process is illustrated in FIG. 6, which only shows a single tile 612. Referring to FIG. 6, first, a µm layer of unintentionally doped (UID) GaN 650 was grown on a sapphire substrate, followed by 0.8 µm of (n-type) silicon-doped GaN 606 and another 0.1 µm of UID GaN 610, where all of these GaN layers 650, 606, 610, were grown by MOCVD. The GaN layers 650, 606, 610 were then patterned to form 10 µm by 10 µm tiles or mesas 612, with the tiles spaced 2 µm apart from one another. The tiles were defined by reactive ion etching (RIE) using a 100 Watt BCl$_3$/Cl$_2$ etch chemistry. The RIE etch defining the tiles went through the upper 0.1 µm UID GaN layer 610 and approximately 0.45 µm into the GaN:Si layer 606. Porosification of the GaN:Si layers 606 was performed by electro-chemical (EC) etching in a 0.3 Molar oxalic acid solution, where the GaN:Si layer acted as the anode and a Pt wire in the solution acted as the cathode. The upper 100 nm UID GaN layer 610 of each tile was not porosified, as it was meant to provide a smooth surface for subsequent MBE regrowth of III-N materials 614. The electro-chemical etch conditions resulted in 50-60% porosification of the GaN:Si layer 606. Following porosification, the samples were subjected to a solvent clean and hydrofluoric acid (HF) dip prior to MBE growth of the overlying III-N materials. All samples were outgassed at 400° C. for one hour in a high vacuum buffer chamber prior to growth.

Next, a 30 nm UID GaN layer 614a was grown on each of the tiles by MBE, followed by MBE growth of an InGaN layer 614 and a 2 nm GaN cap. For one of the wafers, the InGaN layer 614 was 62 nm thick, had a 17% indium fractional composition, and was 13% relaxed. For the other wafer, the InGaN layer 614 was 125 nm thick, had a 20% indium fractional composition, and was 60% relaxed. 2 additional control samples were also formed that were identical to the 2 wafers above, except that the GaN:Si layer was not porosified. In each of the control samples, the InGaN was grown under the same conditions as that of the wafers in which the GaN:Si was porosified.

MBE growth was carried out in a Varian Gen 2 system with conventional high-flux Ga and In effusion cells. The background pressure of the growth chamber was in the low $10^{-10}$ torr in the absence of cell-flux and N$_2$ gas. Active nitrogen was supplied by 1 sccm of 99.9995% pure N$_2$ via a VEECO Unibulb RF plasma source powered at 300 watts. Background pressure in the chamber during growth was approximately $1 \times 10^{-5}$ torr. InGaN growths were carried out under In-rich conditions so to achieve the best possible film quality and surface morphology. For InGaN growth, Ga and In beam equivalent pressure (BEP) was $6.8 \times 10^{-8}$ torr and $7.7 \times 10^{-7}$ torr respectively, resulting in an average growth rate of 1.4 nm/min. The growth temperature was monitored by an optical pyrometer calibrated to the melting point of Al. The growth surface was monitored in-situ by reflection high energy electron diffraction (RHEED). To separate the InGaN from the regrowth interface, all growths were initiated with a thin layer of GaN 614a grown at 720° C. under Ga-rich conditions. For the initial high-temperature GaN growth 614a, a Ga BEP of approximately $1.7 \times 10^{-6}$ torr was used. Prior to the start of growth, the samples were brought up to the GaN growth temperature and the surfaces were exposed to Ga flux for 30 seconds and then thermally desorbed, as observed by RHEED intensity. For both planar and patterned samples on tiles (referred to as PS samples), the Ga desorption time was approximately 25 seconds indicating surface temperature between planar and PS samples were approximately the same. Following initial GaN growth 614a, the substrate temperature was lowered to approximately 615° C. for InGaN growth 614. Following InGaN growth, the 2 nm GaN cap was grown at 615° C.

Figures 9A, 9B:
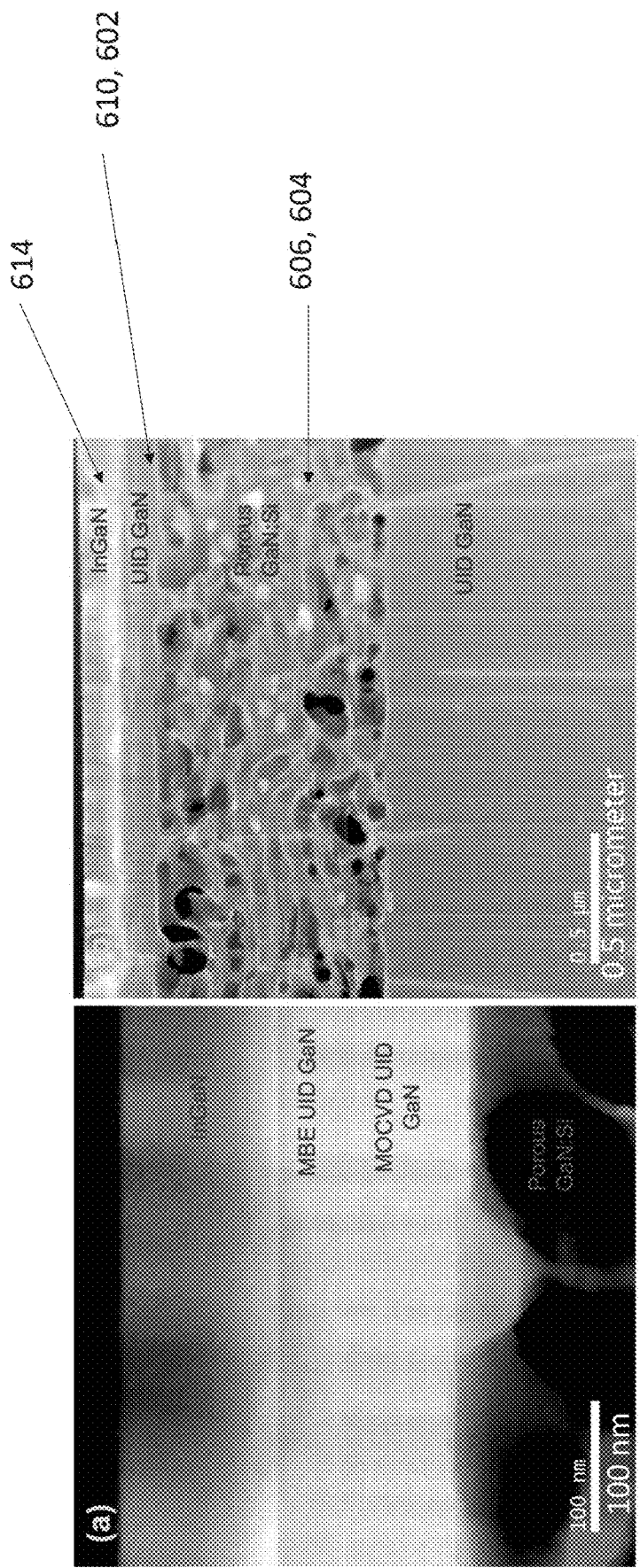
FIGS. 9A-9B: High-angle annular dark-field scanning transmission electron microscopy (STEM-HAADF) images taken from the {1120} zone axis for sample with 125 nm InGaN on GaN tiles. Image in FIG. 9A shows a close-up of the InGaN/GaN/porous GaN stack. Image in FIG. 9B shows a higher magnification image of the same structure. Horizontal white lines seen in the UID GaN layer between the InGaN on porous GaN were found to be associated with pure edge component dislocations.

FIG. 7 shows atomic force microscope (AFM) micrographs of the 2 wafers and of the 2 control samples. As shown, the 125 nm thick relaxed InGaN film 614 on the porous GaN 606 exhibited a root-mean square roughness of only 2 nm with a clearly visible step flow growth. FIG. 8 shows {1124} XRD RSM scans of the 2 wafers and of the 2 control samples. For the control sample with 62 nm of InGaN (layer 614), the indium fractional composition was 12% and the InGaN was coherently strained to the underlying GaN. For the control sample with 125 nm of InGaN (layer 614), the indium fractional composition was 12% and the InGaN (layer 614) was 6% relaxed. On the tiles 612 with embedded porous GaN 606, the relaxation of the InGaN proceeds with increasing thickness, as the 62 nm InGaN layer 614 on porous GaN 606 was 13% relaxed and the 125 nm InGaN layer 614 on porous GaN 606 was 60% relaxed. Furthermore, the indium fractional composition increases from 17% in the 62 nm InGaN film 614 on porous GaN 606 to 20% in the 125 nm InGaN film 614 on porous GaN 606. This is evidence of the composition pulling effect, where more In is incorporated in films 614 that are more relaxed. FIG. 9 is a cross-sectional TEM of the sample with 125 nm InGaN film 614 on porous GaN 606, showing no evidence of threading dislocation generation in the InGaN film 614 grown over the porous GaN 606.

Figure 10A:
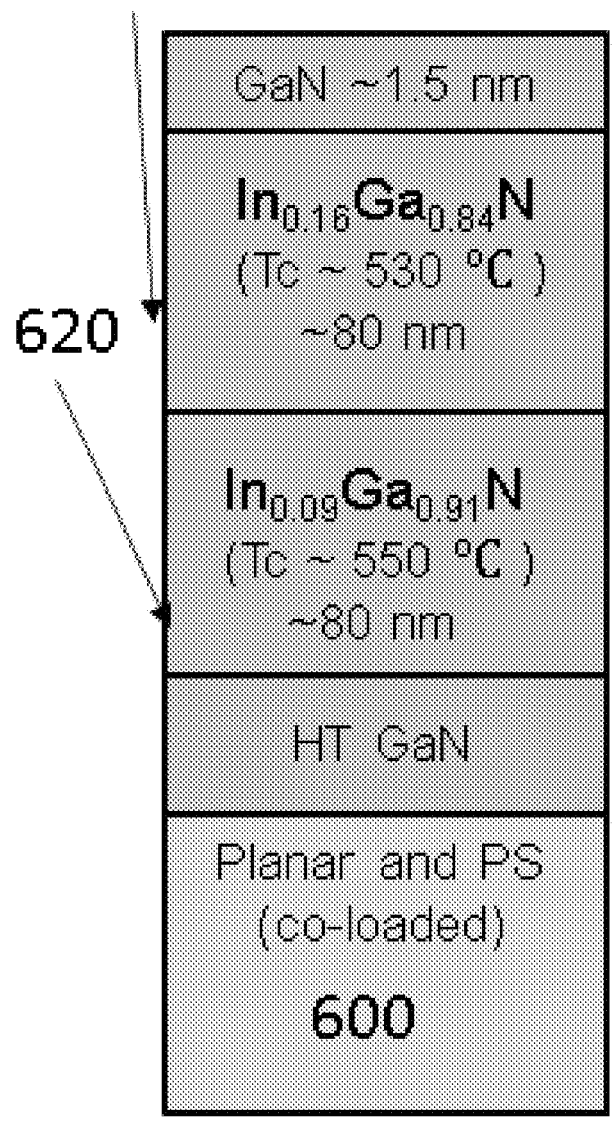
FIG. 10A Schematic of InGaN layers with graded composition deposited on planar GaN and on GaN tiles with embedded porous GaN. Reciprocal space maps of planar sample (FIG. 10B) and sample with GaN tiles (FIG. 10C).
Figure 10B:
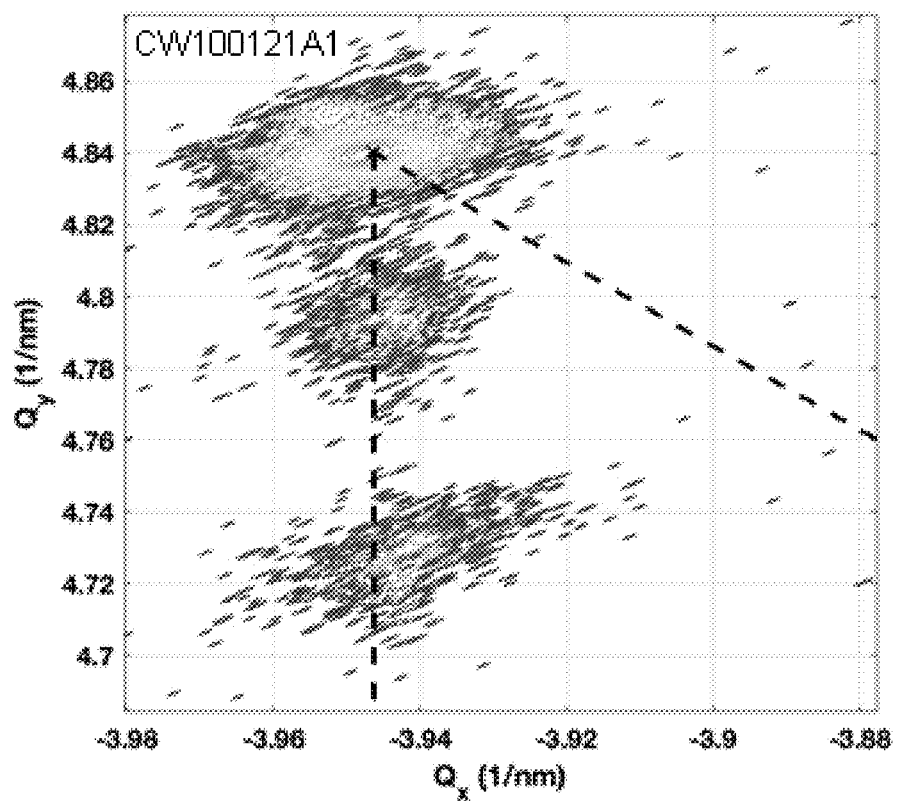
FIGS. 10B-10C, right shows the ~80 nm 550° C. layer on planar GaN is less relaxed than ~80 nm 530° C. layer expected for step grade on planar GaN
Figure 10C:
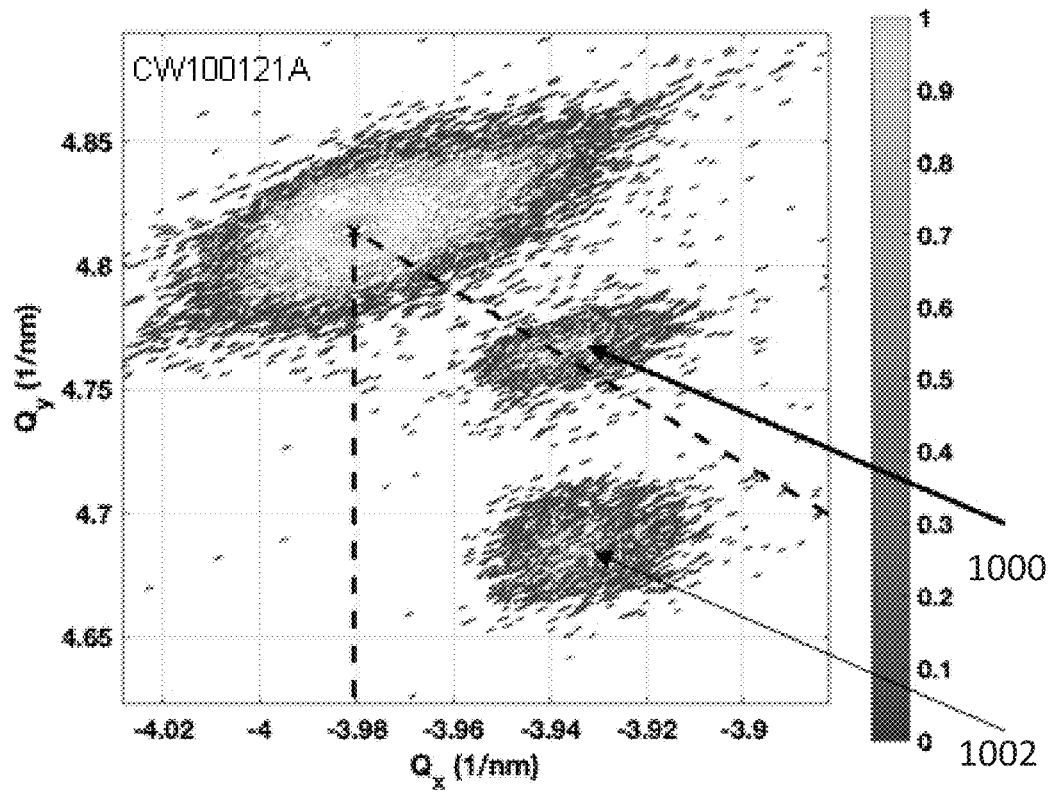

Example 2: Using a Graded InGaN Layer to Achieve Enhanced Relaxation on GaN Tiles with Embedded Porous GaN Using a monotonic step grade from a low indium fractional composition to a higher indium fractional composition in a direction away from the porous GaN layer may reduce the differential strain energy shock to the system and can lead to controlled relaxation. FIG. 10 shows the experimental realization of a InGaN layer 614 comprising such a graded InGaN layer 618 with an initial 80 nm thick layer 620 of 9% In composition followed by an 80 nm thick layer 622 with 16% In composition. There are two significant observations:

1. The InGaN layer 618 was 50% relaxed with an indium fractional composition of 21.2%, while a planar nearly fully strained film grown simultaneously had an indium fractional composition of 15.3%, another verification of the composition pulling effect.
2. The initial InGaN layer 620 was compliant to the layer grown above 622, as is evident from the RSM in FIG. 10 showing that the initial InGaN layer peak 1000 for layer 620 and the second InGaN peak 1002 for layer 622 are vertically aligned.

The equivalent lattice constant, calculated from Vegard's Law, is given by $$a_{new} = 3.1893 \mathring{A} \times \left\{1 - \left(x_{In} \times \frac{R}{100}\right)\right\} + 3.538 \mathring{A} \times x_{In} \times \frac{R}{100}$$

where 3.1893 and 3.538 are the natural in-plane lattice constants for GaN and InN respectively. $x_{in}$ and R refer to the In-composition and relaxation values extracted from the RSM scans respectively. In determining $a_{new}$ from equation 1 using the R and $x_{in}$ values extracted from XRD-RSM data, the equivalent fully relaxed In-composition ($x_{in,equiv}$) can be determined by setting R=100%, $x_{in}=x_{in,equiv}$, and solving for $x_{in,equiv}$.

The equivalent indium fractional composition was found to be 10.8% in the sample with graded InGaN formed on porous GaN. This provides an excellent lattice composition for fabricating long wavelength LEDs and micro LEDs, particularly for the green to the red spectrum.

Figure 11A:
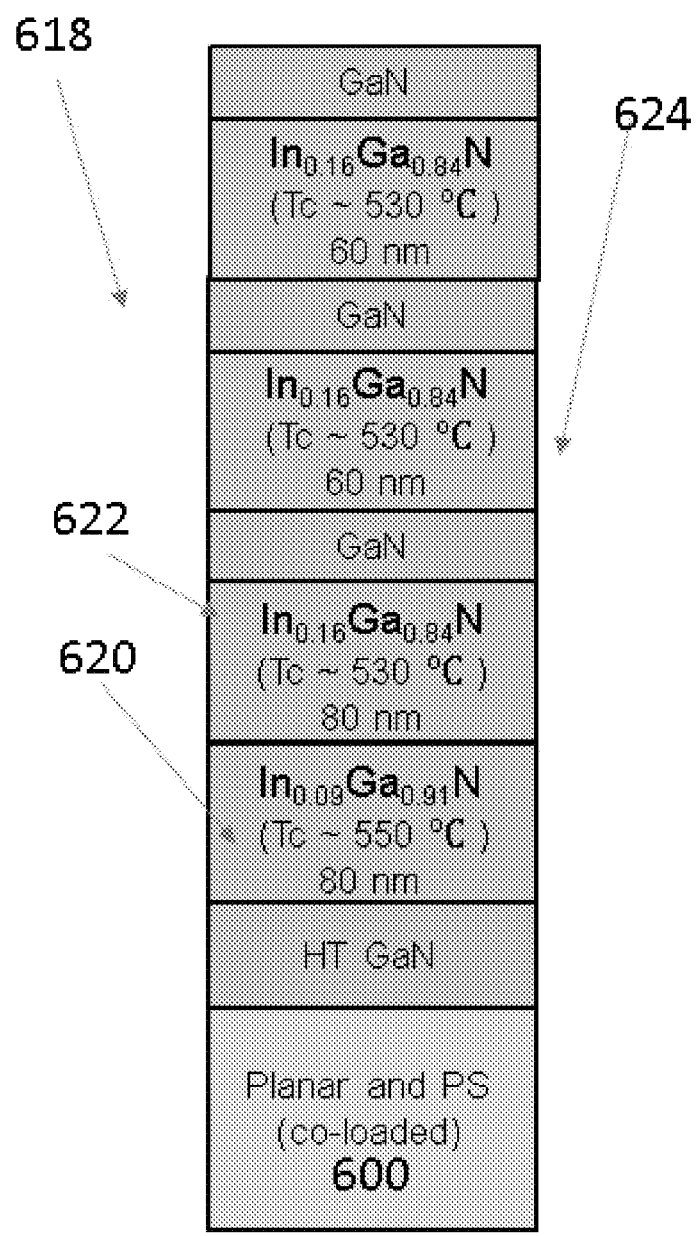
FIG. 11A: Schematic of structure of samples with additional InGaN layers deposited on planar GaN and on GaN tiles with embedded porous GaN.
Figure 11B:
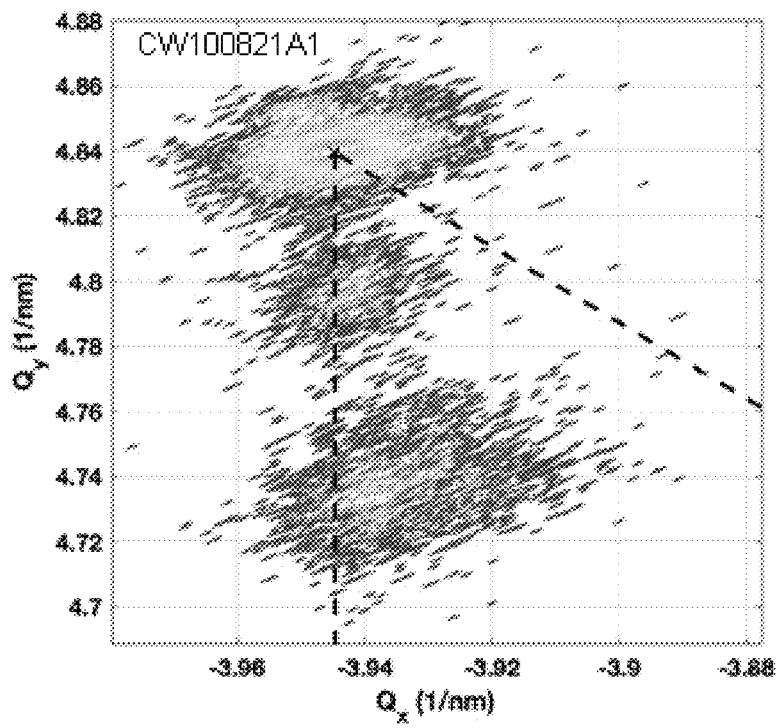
FIGS. 11B-11C show reciprocal space maps of planar sample (FIG. 11B) and sample with GaN tiles (FIG. 11C).
Figure 11C:
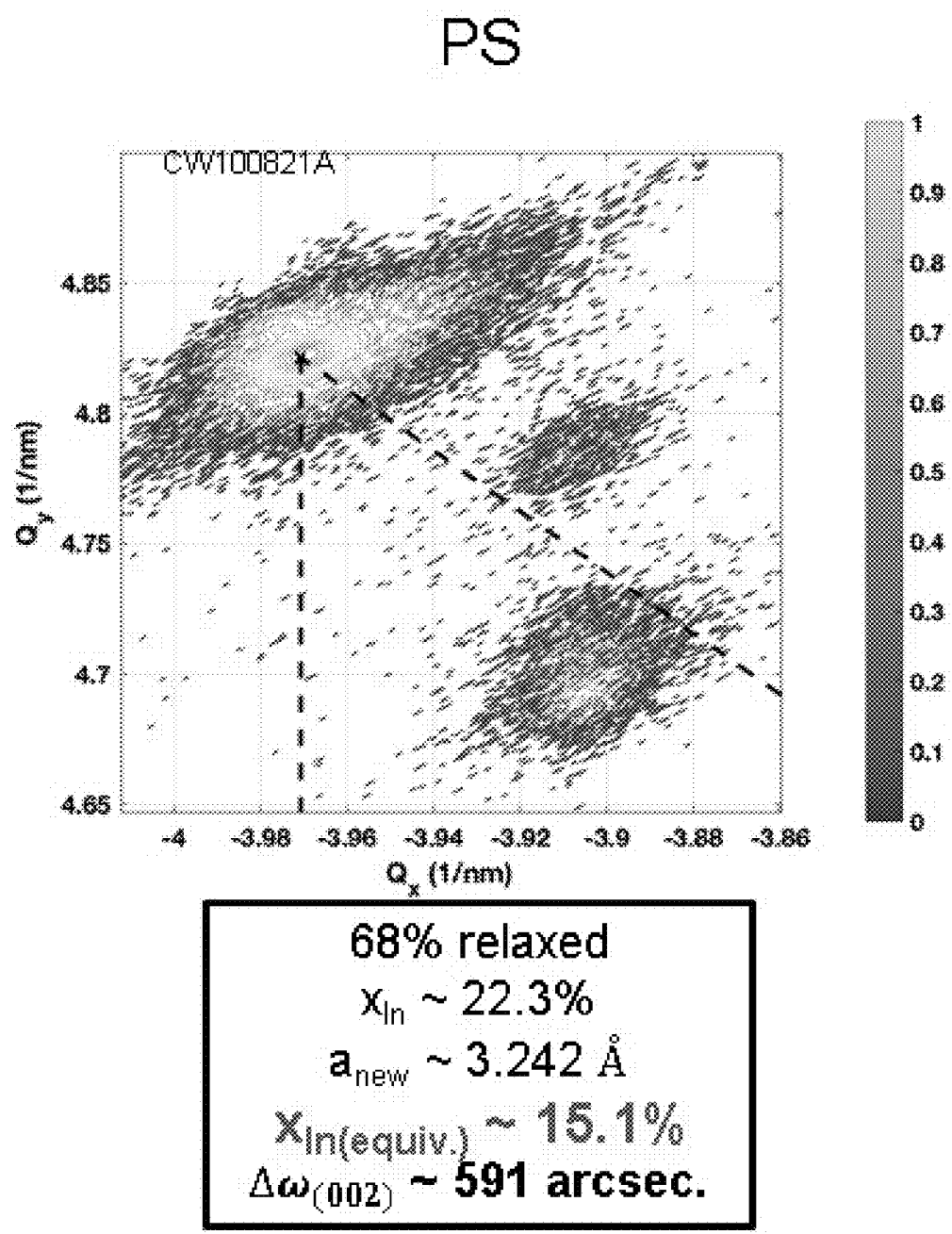

FIG. 11 shows the evolution of both strain relaxation and equivalent In percentage on growing an additional 60 nm thickness of $In_{0.16}Ga_{0.84}N$ layer 624. The relaxation of the film 618 increases to 68% and the In composition increases to 22.3% and the equivalent In percentage increases to 15.1%. There is also evidence that the a-lattice constant of the underlying $In_{0.09}Ga_{0.91}N$ layer increases beyond its relaxed lattice constant as it acts as compliant layer and adopts the lattice constant of the $In_{0.16}Ga_{0.84}N$ layer on top.

Figure 12A:
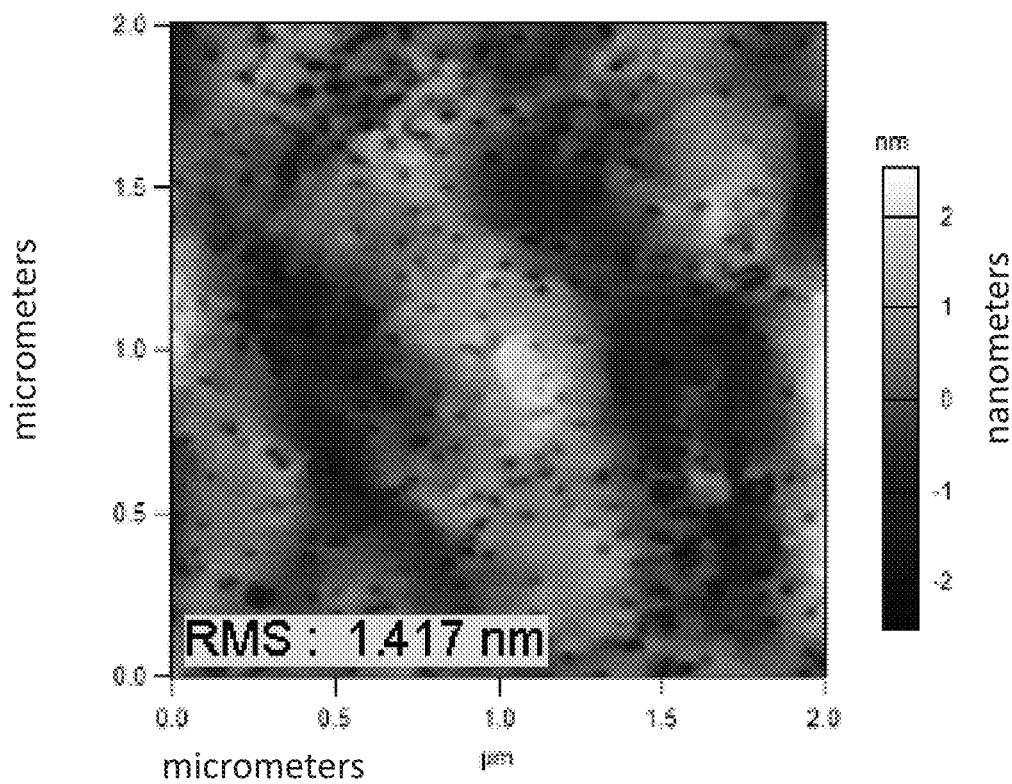
FIGS. 12A-12B: AFM images of samples with additional InGaN layers deposited on planar GaN (FIG. 12A) and on GaN tiles with embedded porous GaN (FIG. 12B).
Figure 12B:
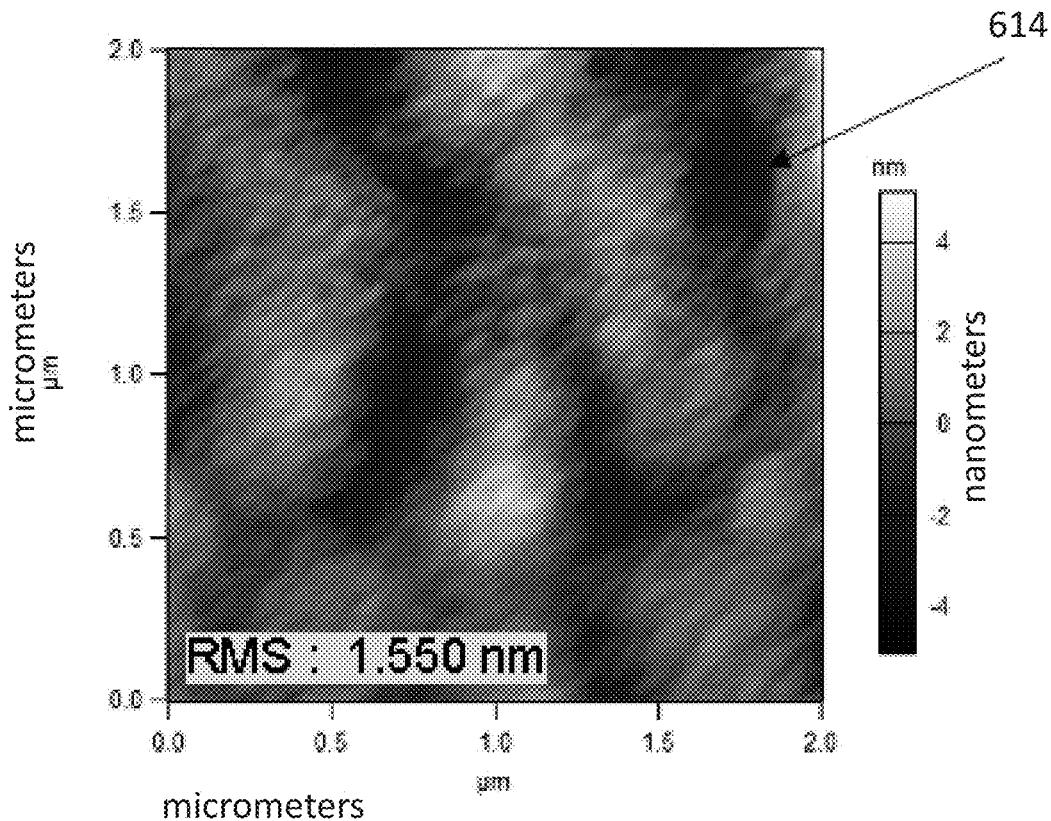

FIG. 12 shows that the surface morphology of the InGaN layer stack 618 deposited on the GaN tiles 612 with embedded porous GaN 606 exhibits much fewer surface pits than when deposited on planar GaN that was co-loaded. The extent of the graded region or the number of layers with step changes in Indium composition can be optimized for relaxation percentage, surface roughness or other parameters for the specific application. The grade can be non-monotonous with step changes increasing and decreasing to control desired outcomes listed above as examples. The surface roughness was well controlled to a maximum of ~2 nm (e.g., over an area of 2 microns by 2 microns) for the most highly relaxed films 614.

Figure 13:
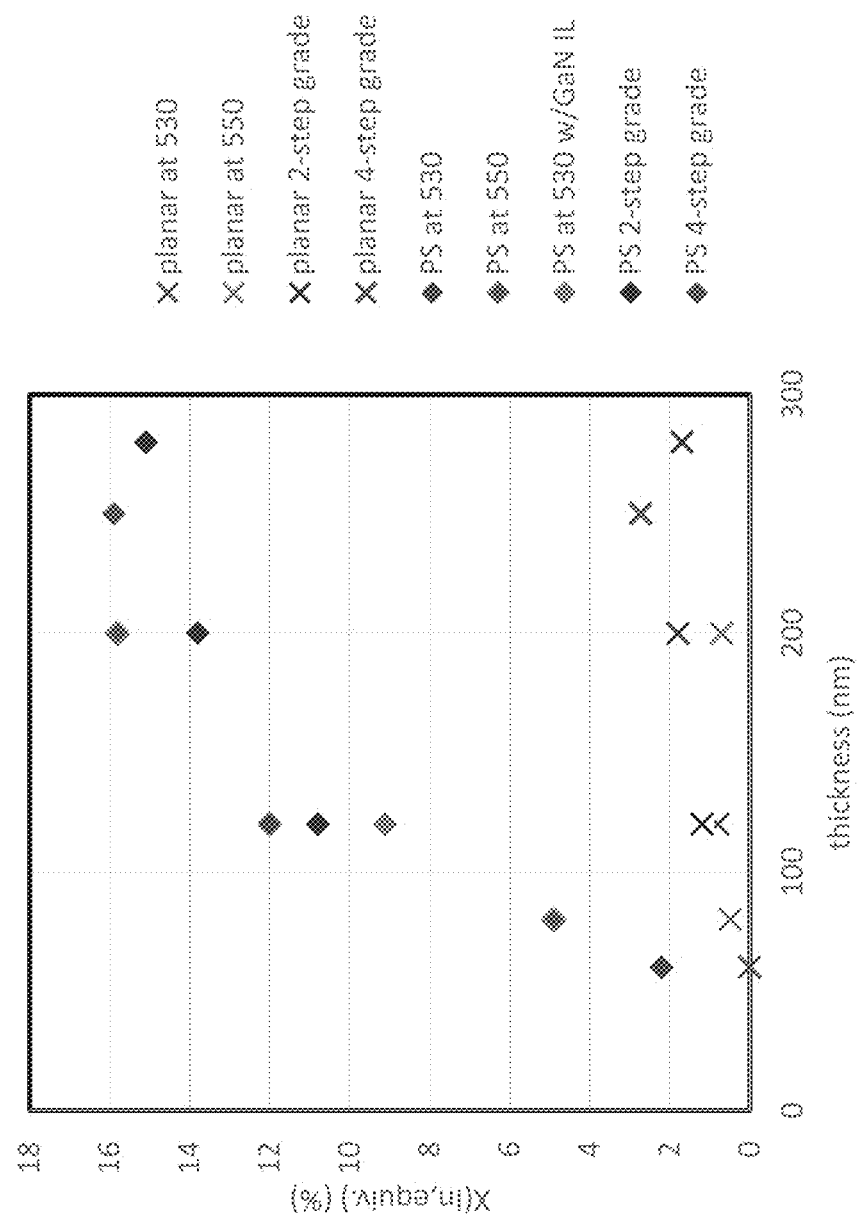
FIG. 13: Relaxation expressed via corresponding equivalent In composition x of a 100% relaxed In$_x$Ga$_{1-x}$N film versus total thickness of all InGaN layers for different samp.

FIG. 13 shows the relaxation and increase in the a-lattice constant expressed via the corresponding equivalent In composition x of a 100% relaxed $In_xGa_{1-x}N$ film 614 of the InGaN layers grown on GaN tiles 612 for the embodiments discussed above. The relaxation is enabled by the porosity of the porous GaN underlayer 606, which possesses a reduced hardness compared to non-porous GaN. The equivalent In composition x of a 100% relaxed $In_xGa_{1-x}N$ film 614 increases with the thickness and composition of the graded InGaN stack 618 and the thickness and In composition of the final InGaN layer 624 and the consequence of the balance of the forces that drive relaxation versus that limit it. The maximum In composition of the pseudo-substrate 616 can be changed by varying the porosity, thickness and composition of the underlying porous III-underlayer 606 (which in the figures is labelled porous GaN, but can be any compliant III-N layer) as well as by the size and geometry of the tile 612. The smaller the tile size, the higher the degree of relaxation and the higher the equivalent In composition will be.

Figure 14C:
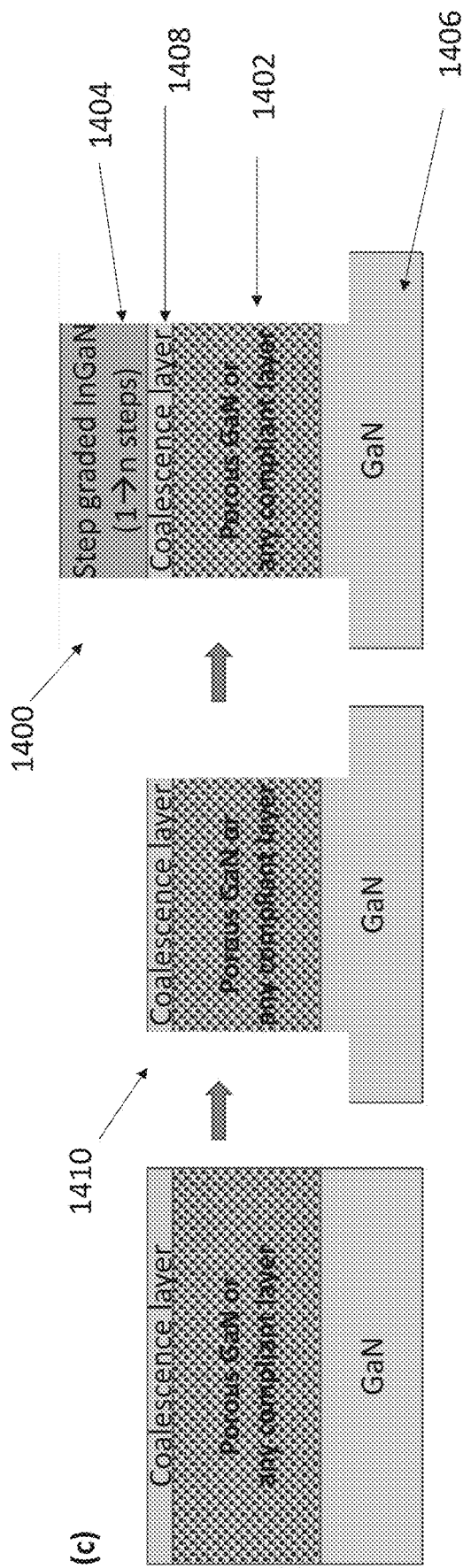

Example 3: Relaxed InGaN on Porous GaN Porosified Via Planar Porosification from the Surface The formation of the relaxed InGaN films 1404 on GaN can also be achieved by the uniform planar porosification of large area GaN layers 1402, as opposed to the lateral porosification of tiled samples. As shown in FIG. 14(a), a large area InGaN layer 1404 can be formed by first porosifying a layer of n-type III-N material 1402 (e.g., n-type GaN) at the surface of the wafer to form porous material at the surface, then growing a thin III-N coalescence layer 1408 (e.g., GaN or InGaN) over the porous layer 1402, and finally growing a relaxed (or partially relaxed) InGaN layer 1404 on the coalescence layer (FIG. 14(a) shows the InGaN layer 1404 as a graded InGaN layer, as was described in Example 2). Alternatively, as shown in FIG. 14(b), after porosification but before growth of the coalescence layer, the sample can be patterned and etched to form a plurality of tiles 1410, as was described in Example 1. Or, as shown in FIG. 14(c), the sample can be patterned and etched to form a plurality of tiles 1410 after growing the coalescence layer but before growing the overlying InGaN.

In each of the examples described above, the InGaN layers 1404, 614 can have a nearly random distribution of In and Ga atoms or can be composed of $In_xGa_{1-x}N/GaN$ or $In_xGa_{1-x}N/In_yGa_{1-y}N$ superlattices or multilayer structures. The $In_xGa_{1-x}N/GaN$ or $In_xGa_{1-x}N/In_yGa_{1-y}N$ superlattices or multilayer structures, which can be fully strained or at least partially relaxed, can be incorporated into sidewall LEDs 1500 as shown in FIGS. 15(a) and 15(b). In FIG. 15(a) the quantum well (QW) is individually injected with holes via a p-contact 1502 whereas the electrons are supplied by the n+ contact 1504 below. In FIG. 15(b), the n contact 1504 is also formed on the sidewall 1506. Here, each QW is individually injected with holes and with electrons as both have sidewall contacts to the LED. Though shown to have vertical sidewalls 1506 the angle of the sidewalls of the LED can be shaped to maximize light extraction. The hole injection is achieved via a p-type regrown layer. The n type contact could be achieved with a direct metal contact (as shown) or with a regrown n+ layer followed by a metal contact.

Figure 16:
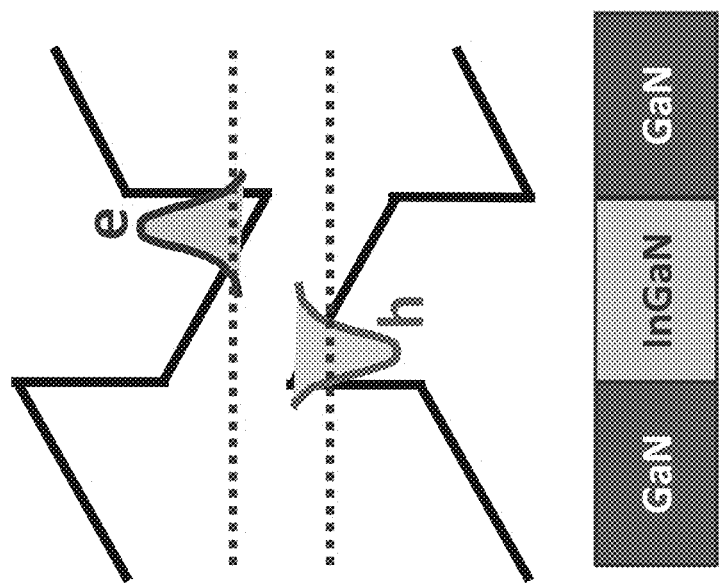
FIG. 16: Band diagram of InGaN quantum well (QW) embedded into GaN

This structure, in which the MQWs are populated in parallel, does not have the burden of the extra voltage drop in the multiple tunnel junctions where the MQWs are populated in series. Lateral LEDs as illustrated in FIGS. 15A and 15B are uniquely attractive in the polar GaN-based system. In the InGaN system, the in-built polarization voltage separates the electrons and holes in the well at low carrier densities, allowing the wells to be uniformly populated by electron and holes by lateral injection as shown in FIG. 16. This is very difficult to achieve in a conventional, non-polar LEDs because the electron-hole recombination that occurs near the p-contact will inhibit the flow of holes laterally to any significant extent beyond the sidewall of the LED. This makes the lateral LED unattractive in the conventional nonpolar materials. Lateral GaN-based LEDs are attractive for low current operation, which is the desired regime for high efficiency, while simultaneously giving large output power because of the large number of QWs populated in parallel.

Example 4

FIGS. 1-4 illustrate an example wherein, in order to form a spontaneous superlattice structure 100 first a high quality 200 nm GaN layer was grown at a high temperature (HT) of 730° C. on the GaN buffer layer 102 (which we will designate as the GaN HT layer). The dislocation density of the buffer layer was <2E8 cm$^{-2}$. The GaN HT layer was grown to separate the regrown interface from the target mismatched InGaN epitaxial film. Transmission Electron Microscopy (TEM) analysis shows a high-quality interface between the GaN buffer layer and the GaN HT layer with no observable generation of additional threading dislocations. The InGaN layer was next grown at 600° C. (growth rate 6 nm per minute), with the In flux and Ga flux maintained unchanged throughout the growth of the film. The InGaN film was 700 nm thick.

Cross-sectional TEM of the resulting material stack 100 show several remarkable features
1. No additional threading dislocations are generated at the interface between the GaN and the InGaN layer (Interface 104 designated by dashed line in FIG. 1)
2. The cross-sectional TEM image (FIG. 2) show three distinct regions: The first "light" region of approximately 10-20 nm thickness represents growth of the initial InGaN layer on the GaN HT layer (Marked Section 1 in FIG. 2). This is followed by a second "dark" region approximately 10-20 nm thick (Marked Section 2 in FIG. 2) and then followed by a periodic superlattice (SL) structure of light and dark regions which is an example of the region 100 graded in composition. Under the applied imaging conditions, light regions typically represent a higher Indium concentration whereas dark regions represent a lower Indium concentration.
3. EDX analysis (FIG. 3), shows that Section 1 represents 20 nm of growth of InGaN of peak composition of nearly 10%.
4. EDX analysis (FIG. 3), shows that the In composition in Section 2 of the film drops to nearly zero (the film composition is close to GaN). This region is approximately 10-20 nm thick.
5. Though approximate, EDX analysis (FIG. 3) of the self-assembled SL region 100 adjacent to Section 2 shows a periodic superlattice (SL) structure of alternating compositions of approximately <7% In in the SL barrier 204 and approximately 15% In in the SL well 202. We refer to this region as Section 3 in FIG. 3a. The periodicity of the superlattice in this region is approximately 6 nm.
6. EDX images of the material near the surface 206 (FIG. 3) show that the self-assembled superlattice structure changes its composition to <7% Indium in the SL barrier and ~24% Indium in the well.
7. Atom Probe Tomography (APT) was conducted on the material near the surface 206 of the sample and the results are shown in the images in FIG. 4. APT, which is more quantitatively accurate than EDX, verifies the oscillation in the Indium composition obtained by EDX and establishes it to be 20% Indium (In to In+Ga ratio is 20%) in the well 202 and nearly 0% Indium in the barrier 204 which we will call the "GaN" layer.

The RSM data on this film 100 shows that the even with the observed increasing net In concentration in the film with increasing thickness, the film remains nearly fully strained at a remarkable thickness of over 700 nm which is 7 times the critical thickness of $In_{0.08}Ga_{0.92}N$ on GaN.

Example 5: InGaN Layer Comprising a Superlattice

Figure 5:
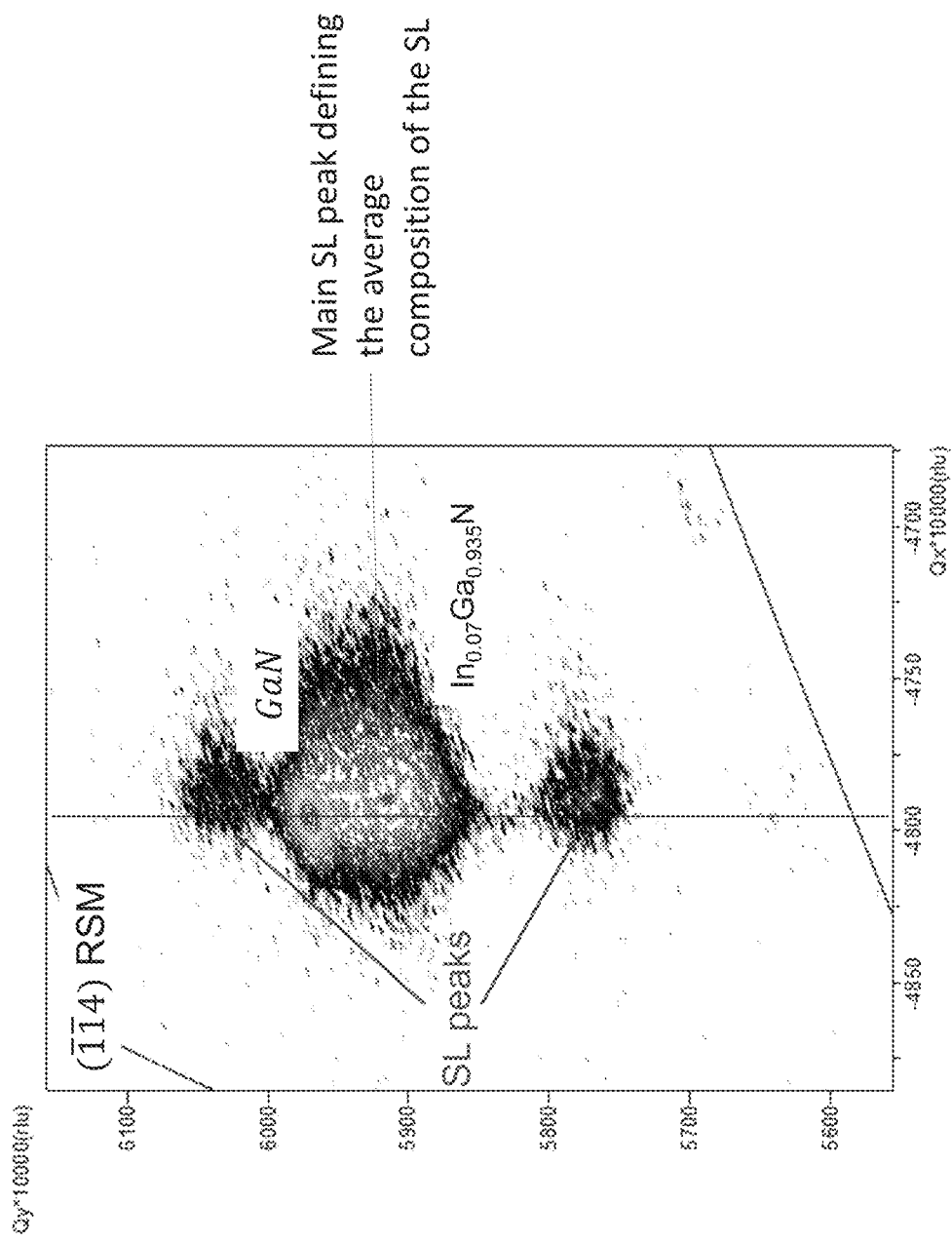
FIG. 5: XRD-RSM recorded around GaN (114) reflection on 700 nm-thick InGaN superlattice (SL) grown on GaN template with threading dislocation density (TDD)<2×10$^8$ cm$^{-2}$.

FIG. 5 illustrates an example where the InGaN layer deposited on the III-N base layer comprises a superlattice comprising alternating GaN and InGaN layers. In one or more examples, the indium fractional composition of a layer or the average indium composition of a (In,Ga)N layer stack (e.g., superlattice) can be determined from XRD-RSM measurement, where the indium composition is derived from the Qx,Qy coordinate of the main peak (e.g., InGaN peak) of the XRD-RSM. However, other means of measuring the indium composition can be used.

Process Steps

Figure 18:
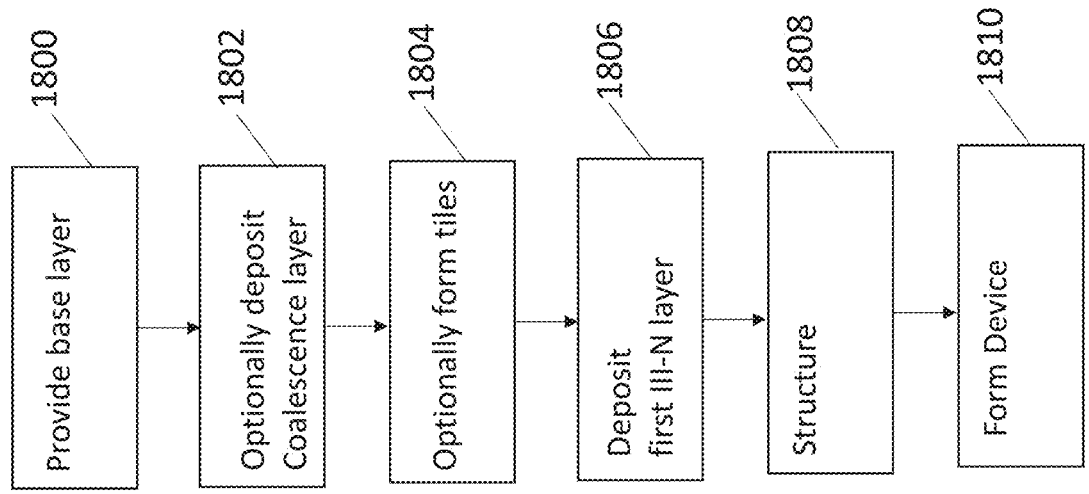
FIG. 18. Flowchart illustrating a method of making a III-N structure according to one or more examples.

FIG. 18 illustrates a method of forming a III-N material structure or device (referring also to FIGS. 6, 7, 9-12, 15, and FIG. 14).

Block 1800 represents providing a III-N base or region, e.g., base layer 600 or 1402, comprising a first portion 602 and a second portion 604, the first portion 602 of the III-N base layer having a first natural lattice constant (e.g., a lattice constant and c lattice constant) and a first dislocation density (e.g., first threading dislocation density).

In one or more examples, the base layer comprises a compliant layer comprising a layer that is compliant to the lattice constant of layers deposited on top (e.g., the compliant stretches or is compressed or stressed according to the lattice constant of, or as a result of the strain induced by, any layer deposited on top.

In one example, providing the III-N base layer 600 comprises depositing (e.g., growing) a first III-Nitride base layer 606 on or above a substrate 608 or template, depositing (e.g., growing) a second III-Nitride base layer 610 on or above the first III-Nitride base layer, and porosifying the first base III-Nitride layer. In this example, the first III-Nitride base layer 606 comprises the second portion 604 and the second III-Nitride base layer 610 comprises the first portion 602. In one or more examples, the porosifying can be performed before or after growing the second III-Nitride base layer. In one or more examples, the porosifying comprises etching the first III-Nitride layer so as to form pores in the first III-Nitride base layer. Example etching techniques include, but are not limited to, photoelectrochemical etching. In one or more examples, the first III-Nitride base layer comprises an n-type layer so as to apply the appropriate electric field to achieve the photoelectrochemical etching.

The first natural lattice constant can be that before or after porosification.

Block 1802 represents optionally epitaxially growing a III-N coalescence layer 1408 on or above the III-Nitride base layer (e.g., on or above the second III-N base layer).

Block 1804 represents optionally patterning the III-N base layer (and optionally the coalescence layer if present) to form a plurality of tiles 612 each comprising the III-N base layer (and optionally the coalescence layer). The patterning can comprise photolithography and etching.

Block 1806 represents epitaxially growing a first III-N layer 614, 1404 over or on or above the III-N base layer 600.

In one or more examples, the first III-N layer 614 is grown on or above the second III-Nitride base layer 610, comprising a non-porous layer, and the first III-N layer has a second natural lattice constant, a second dislocation density, and a thickness greater than 10 nm. In one or more examples, the thickness is less than 10 000 nm.

Figure 17D:
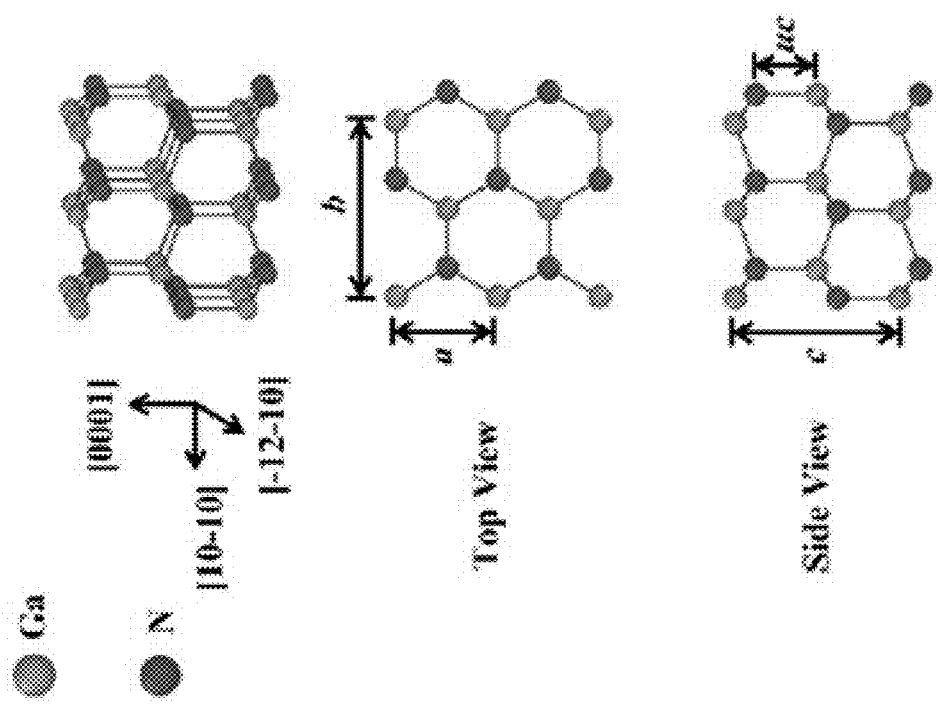
FIG. 17D illustrates example a-lattice constant (a) and example c-lattice constant (c) for GaN.

FIGS. 8, 10, and 11 show that, in one or more examples, an (e.g., average) indium fractional composition of the first III-N layer is greater than 0.1; and less or equal to 1, the second natural lattice constant (e.g., a-lattice constant) is at least 1% greater than the first natural lattice constant (e.g., a-lattice constant); a strain-induced lattice constant (e.g., strain induced a-lattice constant) of the first III-N layer is greater than 1.0055 times the first natural lattice constant. The a lattice constant and In compositions are determined from the XRD reciprocal space maps. In addition, FIG. 9 shows a TEM image showing the second dislocation density is less than 1.5 times the first dislocation density. The strain induced lattice constant is the actual lattice constant of the first III-N layer under the strain induced by the overlying and/or underlying layers. Example a lattice constant and c lattice constant are illustrated in FIG. 17(d).

In one or more examples, the epitaxially growing of the first III-N layer comprises forming the first III-N layer by molecular beam epitaxy. In one or more examples, the first III-N layer is characterized as being substantially free of V-shaped depressions and is inherent to the MBE growth conditions.

Block 1808 represents the end result, a III-N material structure. The III-N structure can be embodied in many ways including, but not limited to, the following examples.

1. FIG. 6 illustrates an example III-N material structure 616 comprising a III-N base layer 600 comprising a first portion 602 and a second portion 604, the first portion of the III-N base layer having a first natural lattice constant (zero strain, which can assessed from XRD reciprocal space maps) and a first dislocation density (e.g., first threading dislocation density); and a first III-N layer 614 having a second natural lattice constant and a second dislocation density on the III-N base layer. In one or more examples, the III-N (e.g., GaN) UID layers and the n-type layers for future porosification (collectively the III-N base layer) can be deposited on foreign substrates such as Sapphire or Silicon Carbide with a threading dislocation density (in the non-porous portion of the III-N base layer) of less than $8 \times 10^8$ cm$^{-2}$, or Silicon with a threading dislocation density (in the non-porous portion of the III-N base layer) of less than $2 \times 10^9$ cm$^{-2}$, or on bulk GaN with less than $1 \times 10^8$ cm$^{-2}$ dislocations. Thereby the first III-N layer is capable of having a thickness greater than 10 nm; wherein the indium fractional composition of the first III-N layer or the average composition (e.g., average indium composition) of an (In,Ga)N multilayer structure (e.g., superlattice) is greater than 0.1; the second natural lattice constant is at least 1% greater than the first natural lattice constant; a strain-induced lattice constant of the first III-N layer is greater than 1.0055 times the first natural lattice constant; and the second dislocation density (e.g., second threading dislocation density) is less than 1.5 times the first dislocation density. In one or more examples, the indium fractional composition of a layer or the average indium composition of a (In,Ga)N layer stack (e.g., superlattice) can be determined from XRD-RSM measurement, where the indium composition is derived from the Qx,Qy coordinate of the main peak (e.g., InGaN peak) of the XRD-RSM. However, other means of measuring the indium composition can be used.

2. The III-N material structure of example 1, wherein the second portion 604 of the III-N base layer 600 comprises a porous III-N material 606.

3. The III-N material structure of example 1 or 2, wherein the second portion 604 of the III-N base layer comprises porous n-type GaN 606.

4. The III-N material structure of any of the examples 2-3, wherein at least 33% of a volume of the porous n-type GaN 606 comprises one or more pores.

5. The III-N material structure of any of the examples 1-4, wherein the first III-N layer 614 comprises a material selected from the group consisting of $In_xGa_{1-x}N$ ($0<x\leq 1$), $Al_yIn_{1-y}N$ ($0<y<1$), and $Al_wIn_zGa_{1-w-z}N$ ($0<w<1$, $0<z<1$, and $w+z<1$).

6. The III-N material structure of any of the examples 1-5, wherein the first III-N layer 614 is characterized as being substantially free of V-shaped depressions. The V-shaped depressions are observed by Atomic Force microscopy. In one or more examples, the number density of V shaped depressions is less than $1 \times 10^8$ cm'.

7. The III-N material structure of any of the examples, wherein the first III-N layer 614 is part of a stack comprising a plurality of III-N layers 618, wherein an indium composition of each III-N layer 620 of the stack increases monotonically in a direction away from the III-N base layer.

8. The III-N material structure of any of the examples 1-7, wherein the material structure 616 comprises a plurality of tiles or mesas 612, each tile comprises the first III-N layer, and the first III-N layer of each tile is separated from the first III-N layer 614 of every other tile by a distance of at least 10 nm. In one or more examples, the distance is less than 10000 nm.

9. FIG. 14 further illustrates a III-N material structure 1400, comprising:
   a porous III-N layer 1402 having a first natural lattice constant; and
   a first III-N layer 1404 having a second natural lattice constant on the porous III-N layer, the first III-N layer having a thickness greater than 10 nm; wherein
   an (e.g. average) indium fractional composition of the first III-N layer is greater than 0.1;
   the second natural lattice constant is at least 1% greater than the first natural lattice constant; and
   a strain-induced lattice constant of the first III-N layer is greater than 1.0055 times the first natural lattice constant.

10. The III-N material structure of example 9, further comprising a substrate 1406 selected from the group consisting of silicon, sapphire, gallium nitride, aluminum nitride, and silicon carbide.

11. The III-N material structure of example 9 or 10, further comprising a III-N coalescence layer 1408 having a third natural lattice constant between the porous III-N layer and the first III-N layer.

12. The III-N material structure of example 11, wherein the third natural lattice constant is different from the second natural lattice constant. 13. The III-N material structure of any of the examples 9-12, wherein the first III-N layer 1404 comprises a material selected from the group consisting of $In_xGa_{1-x}N$ ($0<x\leq 1$), $Al_yIn_{1-y}N$ ($0<y<1$), and $Al_wIn_zGa_{1-w-z}N$ ($0<w<1$, $0<z<1$, and $w+z<1$).

14. The III-N material structure of any of the examples 9-13, wherein the first III-N layer 1404 is characterized as being substantially free of V-shaped depressions (e.g., less than $1\times10^8$ cm$^{-2}$ V shaped depressions).

15. The III-N material structure of any of the examples, wherein the first III-N layer 1404 is part of a stack comprising a plurality of III-N layers, wherein an indium composition of each III-N layer of the stack increases monotonically in a direction away from the III-N base layer 1404.

16. The III-N material structure of any of the examples 1-7, wherein the material structure 1400 comprises a plurality of mesas or tiles 1410, each tile comprises the first III-N layer, and the first III-N layer 1404 of each tile is separated from the first III-N layer of every other tile by at least 10 nm. In one or more examples, the tiles or mesas are separated by a distance of less than 10000 nm.

17. The III-N structure of any of the examples 1-16, wherein a combination of using porous layer and MBE growth for the first III-N layer enables the average indium fractional composition of the first III-N layer is greater than 0.1; the second natural lattice constant is at least 1% greater than the first natural lattice constant; the strain-induced lattice constant of the first III-N layer is greater than 1.0055 times the first natural lattice constant; and the second dislocation density is less than 1.5 times the first dislocation density.

18. The III-N structure of any of the examples 1-17, wherein the degree to which the second natural lattice constant increases above 1% up to 11% and the strain induced lattice constant increases above 1.00055 times is a function of one or more of the following: (1) the amount or content of indium incorporated into the first III-N layer (e.g., as the content of indium is increased from 0.1 to 1, the larger the natural lattice constant and larger the strain induced lattice constant); (2) the increasing thickness of the first III-N layer (e.g., as the thickness is increased from 10 nm to 10000 nm, the second natural lattice constant increases by larger amounts from 1% to 11%); and (3) the decreasing tile/mesa size.

19. The III-N structure of example 18, wherein increasing the indium content and the second natural lattice constant does not increase, or does not significantly increase, the second dislocation density, e.g., if the relaxation is elastic.

20. A substrate or pseudo-substrate comprising the III-N structure of any of the examples 1-19.

21. The first III-N structure of any of the examples 1-19, wherein the first III-N layer 614, 1404 is substantially free of the V-defects or V-depressions 1700 of the type illustrated in FIG. 17, e.g., comprising a polyhedron shaped structure 1700 or as shown and described in the reference by Yufeng Li et. al., entitled "Nanoscale Characterization of V-Defect in InGaN/GaN QWs LEDs Using Near-Field Scanning Optical Microscopy," Nanomaterials 2019, 9, 633, http://dx.doi.org/10.3390/nano9040633, which reference is incorporated by reference herein. FIG. 17 illustrates the V-depression is terminated by a threading dislocations 1702 and further comprises sidewalls or 1704 facets of a pit or depression.

22. The III-N structure of any of the examples 1-21, wherein the first III-N layer 614, 1404 has a surface roughness of 2 nanometers or less over a surface area of at least 2 micrometers by 2 micrometers.

23. The III-N structure of any of the examples 1-22, wherein the second natural constant a2 (e.g., a lattice constant) is $a2 \geq a1+(1/100)*a1$, where a1 is the first natural lattice constant.

24. The III-N structure of any of the examples 1-23, wherein the second natural constant a2 (e.g., a lattice constant) is $a1+(1/100)*a1 \leq a2 < a1+(5/100)*a1$.

25. The III-N structure of any of the examples 1-23, wherein the second natural constant a2 (e.g., a lattice constant) is $a1+(1/100)*a1 \leq a2 < a1+(2/100)*a1$.

26. The III-N structure of any of the examples 1-23, wherein the second natural constant a2 (e.g., a lattice constant) is $a1+(1/100)*a1 \leq a2 < a1+(3/100)*a1$.

27. The III-N structure of any of the examples 1-26, wherein the second natural constant a2 (e.g., a lattice constant) is $a1+(1/100)*a1 \leq a2 < amax$ where amax is the natural lattice constant of a second III-N layer 622 deposited on the first III-N layer 614, 1404, when the second III-N layer 622 comprises 5 times (or 500% of) the indium composition in the first III-N layer 614, 1404.

28. The III-N structure of any of the examples 1-26, wherein the second natural constant a2 (e.g., a lattice constant) is $a1+(1/100)*a1 \leq a2 < amax$ where amax is the natural lattice constant of a second III-N layer 622 deposited on the first III-N layer 614, 1404, when the second III-N layer 622 comprises 3 times (or 300% of) the indium composition in the first III-N layer 614, 1404.

29. The III-N structure of any of the examples 1-26, further comprising a plurality n of layers on the III-N base layer, the plurality of layers comprising the first III-N layer and one or more additional layers on the first III-N layer, wherein $a1+(1/100)*a_1 \leq a_n < amax$ where an is the lattice constant of the nth III-N layer and amax is the natural lattice constant of the (n+1)th III-N layer deposited on the $n^{th}$ III-N layer, when the $(n+1)^{th}$ III-N layer comprises 5 times (or 500% of) the indium composition in the $n^{th}$ III-N layer, or when the $(n+1)^{th}$ III-N layer comprises 3 times (or 300% of) the indium composition in the $n^{th}$ III-N layer.

30. The III-N structure of any of the examples 1-29, wherein the strain induced a-lattice constant aS of the first III-N layer is $aS \geq a1*1.0055$, where a1 is the first natural lattice constant.

31. The III-N structure of any of the examples 1-29, wherein the strain induced a-lattice constant aS of the first III-N layer is $1.0055*a1 \leq aS < a1+(2/100)*a1$.

32. The III-N structure of any of the examples 1-29, wherein the strain induced a-lattice constant aS of the first III-N layer is $1.0055*a1 \leq aS < a1+(3/100)*a1$.

33. The III-N structure of any of the examples 1-29, wherein the strain induced a-lattice constant aS of the first III-N layer is $1.0055*a1 \leq aS < a1+(10/100)*a1$ (e.g., when the first III-N layer comprises InN).

34. The III-N structure of any of the examples 1-29, wherein the strain induced a-lattice constant aS of the first III-N layer is $1.0055*a1 \leq aS < amax$, where amax is the natural lattice constant of a second III-N layer 622 deposited on the first III-N layer 614, 1404, when the second III-N layer 622 comprises 5 times (or 500% of) the indium composition in the first III-N layer 614, 1404.

35. The III-N structure of any of the examples 1-29, wherein the strain induced a-lattice constant aS of the first III-N layer is $1.0055*a1 \leq aS < amax$, where amax is the natural lattice constant of a second III-N layer 622 deposited on the first III-N layer 614, 1404, when the second III-N layer 622 comprises 3 times (or 300% of) the indium composition in the first III-N layer 614, 1404.

36. The III-N structure of any of the examples 1-29, further comprising a plurality n of layers on the III-N base layer (e.g., comprising GaN), the plurality of layers (e.g., each comprising indium) comprising the first III-N layer and one or more additional layers on the first III-N layer, wherein the strain induced a-lattice constant aSn of the $n^{th}$ III-N layer is 1.0055*a1≤aSn<amax where amax is the natural lattice constant of the $(n+1)^{th}$ III-N layer deposited on the $n^{th}$ III-N layer, when the $(n+1)^{th}$ III-N layer comprises 5 times (or 500% of) the indium composition in the $n^{th}$ III-N layer, or when the $(n+1)^{th}$ III-N layer comprises 3 times (or 300% of) the indium composition in the $n^{th}$ III-N layer.

37. The III-N structure of any of the examples 1-36, wherein the first III-N layer comprises a superlattice comprising indium containing layers (e.g., InGaN or InN) and GaN layers.

38. The III-N structure of any of the examples 1-36, wherein the first III-N layer comprises indium (e.g., InGaN or InN). In one or more examples, the composition is random.

39. The III-N structure of any of the examples 1-38, further comprising one or more additional III-N layers (e.g., comprising InN or InGaN) on the first III-N layer. In one or more examples, the composition is random. In one or more further examples, the composition is a SL.

Block 1810 represents utilizing the III-N structure of any of the examples 1-38 as a substrate for a device and optionally processing or growing the structure into a device. In one or more examples, device layers for an LED, laser, photodetector, solar cell, or transistor are grown on the first III-N layer. In one or more examples, the first III-N layer comprises an active region or other layer in the device. The step may further comprise depositing anode, cathode, or other metal contacts for biasing or reading electrical signals from the device. FIG. 15 illustrates an example where the III-N structure 616, 1400 is processed into an LED 1500. The device can comprise a substrate or an electronic or electronic device comprising or deposited on the substrate.

40. A device comprising and/or deposited on or above the III-N structure of any of the examples 1-39, wherein the III-N structure is a mechanical layer or buffer layer or substrate and does not comprise a layer selected for its optical properties (e.g., the III-N structure does not comprise an active region used to absorb or emit electromagnetic radiation).

41. A device comprising or deposited on or above the III-N structure of any of the examples 1-40, wherein the first III-N layer is grown by MBE and subsequent device layers grown on or above the first III-N layer comprise one or more layers (including an active region) grown by MOCVD or a deposition method different from MBE. In one or more examples, this is used when the indium containing light emitting active regions comprising InGaN and/or InGaN grown by MBE exhibit poor optical properties that would not be suitable for use in a light emitting device.

42. The device or III-N structure of any of the examples 1-41, wherein the first III-N layer 614, 1404 comprises a higher indium composition that is actually incorporated into the first III-N layer 614, 1404, wherein the incorporated indium composition is measured to be higher (e.g., via at least one of XRD reciprocal space map measurement, Energy Dispersive X-ray Spectroscopy (EDS), or APT analysis) than that expected for growth of another otherwise equivalent first III-N layer grown by MOCVD and/or without the compliant base layer 600, wherein the higher indium composition is commensurate with or in accordance with the increased relaxation of the first III-N layer 614, 1404 characterized by the second natural lattice constant being at least 1% greater than the first natural lattice constant and the strain-induced lattice constant of the first III-N layer being greater than 1.0055 times the first natural lattice constant.

43. The device or III-N structure of example 42, wherein the higher indium composition is in accordance with composition pulling where more In is incorporated in films 614 that are more relaxed.

44. The device or III-N structure of any of the examples 42-43 accompanied by a data sheet or specification specifying the higher indium composition or a property (e.g., electrical or optical property) associated with the higher indium composition.

45. The device comprising the III-N structure of any of the examples 42-44 comprising a property (e.g., electrical or optical property) associated with or resulting from the higher indium composition.

46. The device or III-N structure of any of the examples, wherein the first natural lattice constant is before or after the porosification to form the pores.

Advantages and Improvements

The present disclosure reports on the surprising and unexpected discovery that in one or more examples, that growth of the first III-N layer by MBE allows the first III-N layer to be grown thicker and with higher In composition (enabling a larger second lattice constant), and with increased morphology (i.e., without the formation of V-defects in the first III-N layer), as compared to growth of the first III-N layer by MOCVD. Indeed, in one or more examples, the same first III-N layer grown by MOCVD would have very poor morphology unsuitable for use in device fabrication.

Nomenclature

GaN and its ternary and quaternary compounds incorporating aluminum and indium (AlGaN, InGaN, AlInGaN) are commonly referred to using the terms (Al,Ga,In)N, III-nitride, III-N, Group III-nitride, nitride, Group III-N, $Al_{(1-x-y)}In_yGa_xN$ where 0<x<1 and 0<y<1, or AlInGaN, as used herein. All these terms are intended to be equivalent and broadly construed to include respective nitrides of the single species, Al, Ga, and In, as well as binary, ternary and quaternary compositions of such Group III metal species. Accordingly, these terms comprehend the compounds AlN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species. Further, (Al,Ga,In)N materials within the scope of the invention may further include minor quantities of dopants and/or other impurity or inclusional materials. Boron (B) may also be included, so that the terms "III-Nitride", "III-N", refer to any allow of group three (B,Al, Ga,In) nitride semiconductors that are described by $B_wAl_xGa_yIn_zN$, where $0 \leq w \leq 1$, $0 \leq x \leq 1$, $0 \leq y \leq 1$, $0 \leq z \leq 1$, and $w+x+y+z=1$. Compositions can range from containing a single group three element to all four. In other examples, transition metals such as Scandium (Sc) or Yttrium (Y), for example. On the group-V side, Phosphorus (P), Arsenic (As), Antimoni (Sb), and Bismut (Bi) can be included.

Polar Nitride-based optoelectronic and electronic devices are subject to polarization-induced effects because they employ nitride films grown in the polar c-direction [0001] or [000-1], the axis along which the spontaneous and piezoelectric polarization of nitride films are aligned. Since the total polarization of a nitride film depends on the composition and strain state, discontinuities exist at interfaces between adjacent device layers and are associated with fixed sheet charges that give rise to internal electric fields.

One approach to reducing polarization effects in (Ga,Al, In,B)N devices is to grow the devices on semi-polar planes of the crystal. The term "semi-polar plane" (also referred to as "semipolar plane") can be used to refer to any plane that cannot be classified as c-plane, a-plane, or m-plane. In crystallographic terms, a semi-polar plane may include any plane that has at least two nonzero h, i, or k Miller indices and a nonzero l Miller index.

Some commonly observed examples of semi-polar planes include the (11-22), (10-11), and (10-13) planes. Other examples of semi-polar planes in the wurtzite crystal structure include, but are not limited to, (10-12), (20-21), and (10-14). The nitride crystal's polarization vector lies neither within such planes or normal to such planes, but rather lies at some angle inclined relative to the plane's surface normal. For example, the (10-11) and $(10^{-13})$ planes are at 62.98° and 32.06° to the c-plane, respectively.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A III-N material structure, comprising:
a III-N base layer comprising a first portion and a second portion, the first portion of the III-N base layer having a first natural lattice constant and a first dislocation density; and
a first III-N layer having a second natural lattice constant and a second dislocation density on the III-N base layer, the first III-N layer having a thickness greater than 10 nm; wherein
an indium fractional composition of the first III-N layer is greater than 0.01;
the second natural lattice constant is at least 1% greater than the first natural lattice constant;
a strain-induced lattice constant of the first III-N layer is greater than 1.0055 times the first natural lattice constant; and
the second dislocation density is less than 1.5 times the first dislocation density.

2. The III-N material structure of claim 1, wherein the second portion of the III-N base layer comprises a porous III-N material.

3. The III-N material structure of claim 1, wherein the second portion of the III-N base layer comprises porous n-type GaN.

4. The III-N material structure of claim 3, wherein at least 33% of a volume of the porous n-type GaN comprises one or more pores.

5. The III-N material structure of claim 3, wherein the first III-N layer comprises a material selected from the group consisting of $In_xGa_{1-x}N$ ($0<x \leq 1$), $Al_yIn_{1-y}N$ ($0<y<1$), and $Al_wIn_zGa_{1-w-z}N$ ($0<w<1$, $0<z<1$, and $w+z<1$).

6. The III-N material structure of claim 1, wherein the first III-N layer is characterized as being substantially free of V-shaped depressions.

7. The III-N material structure of claim 1, wherein the first III-N layer is part of a stack comprising a plurality of III-N layers, wherein an indium composition of each III-N layer of the stack increases monotonically in a direction away from the III-N base layer.

8. The III-N material structure of claim 1, wherein the material structure comprises a plurality of tiles, each tile comprises the first III-N layer, and the first III-N layer of each tile is separated from the first III-N layer of every other tile by at least 10 nm.

9. A III-N material structure, comprising:
a porous III-N layer having a first natural lattice constant; and
a first III-N layer having a second natural lattice constant on the porous III-N layer, the first III-N layer having a thickness greater than 10 nm; wherein
an indium fractional composition of the first III-N layer is greater than 0.1;
the second natural lattice constant is at least 1% greater than the first natural lattice constant; and
a strain-induced lattice constant of the first III-N layer is greater than 1.0055 times the first natural lattice constant.

10. The III-N material structure of claim 9, further comprising a substrate selected from the group consisting of silicon, sapphire, gallium nitride, aluminum nitride, and silicon carbide.

11. The III-N material structure of claim 9, further comprising a III-N coalescence layer having a third natural lattice constant between the porous III-N layer and the first III-N layer.

12. The III-N material structure of claim 11, wherein the third natural lattice constant is different from the second natural lattice constant.

13. A method of forming a III-N material structure, comprising:
providing a III-N base layer comprising a first portion and a second portion, the first portion of the III-N base layer having a first natural lattice constant and a first dislocation density; and
epitaxially growing a first III-N layer over the III-N base layer, the first III-N layer having a second natural lattice constant, a second dislocation density, and a thickness greater than 10 nm; wherein
an indium fractional composition of the first III-N layer is greater than 0.1;

the second natural lattice constant is at least 1% greater than the first natural lattice constant;

a strain-induced lattice constant of the first III-N layer is greater than 1.0055 times the first natural lattice constant; and the second dislocation density is less than 1.5 times the first dislocation density.

14. The method of claim 13, wherein the epitaxially growing of the first III-N layer comprises forming the first III-N layer by molecular beam epitaxy.

15. The method of claim 14, wherein the first III-N layer is characterized as being substantially free of V-shaped depressions.

16. The method of claim 13, further comprising causing the second portion of the III-N base layer to be porous prior to the epitaxially growing of the first III-N layer.

17. The method of claim 13, further comprising epitaxially growing a III-N coalescence layer before the epitaxially growing of the first III-N layer.

18. The method of claim 13, wherein the III-N base layer is patterned to form a plurality of tiles prior to the epitaxially growing of the first III-N layer.

* * * * *